United States Patent
Mori

(10) Patent No.: US 10,224,372 B2
(45) Date of Patent: Mar. 5, 2019

(54) THREE-DIMENSIONAL MEMORY DEVICE WITH VERTICAL BIT LINES AND REPLACEMENT WORD LINES AND METHOD OF MAKING THEREOF

(71) Applicant: SANDISK TECHNOLOGIES LLC, Plano, TX (US)

(72) Inventor: Yoshio Mori, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 15/603,989

(22) Filed: May 24, 2017

(65) Prior Publication Data

US 2018/0342557 A1 Nov. 29, 2018

(51) Int. Cl.
*H01L 45/00* (2006.01)
*H01L 27/24* (2006.01)

(52) U.S. Cl.
CPC ...... *H01L 27/2481* (2013.01); *H01L 45/1226* (2013.01); *H01L 45/1683* (2013.01)

(58) Field of Classification Search
CPC ............. H01L 27/2481; H01L 45/1226; H01L 45/1683; H01L 45/12; H01L 45/22
See application file for complete search history.

(56) References Cited

U.S. PATENT DOCUMENTS

| | | | |
|---|---|---|---|
| 5,915,167 A | 6/1999 | Leedy | |
| 7,897,440 B1 * | 3/2011 | Horch | G11C 11/39 257/107 |
| 9,230,793 B2 | 1/2016 | Pachamuthu et al. | |
| 9,305,932 B2 | 4/2016 | Kanakamedala et al. | |
| 9,419,058 B1 | 8/2016 | Takaki et al. | |
| 9,583,539 B2 | 2/2017 | Takaki | |
| 9,620,514 B2 * | 4/2017 | Kai | H01L 27/11556 |
| 9,620,712 B2 | 4/2017 | Hayashi et al. | |
| 9,627,399 B2 * | 4/2017 | Kanakamedala | H01L 27/11578 |
| 9,666,799 B2 * | 5/2017 | Yanagida | H01L 45/141 |

(Continued)

FOREIGN PATENT DOCUMENTS

WO WO2007/004843 A1 1/2007

OTHER PUBLICATIONS

U.S. Appl. No. 15/354,067, filed Nov. 17, 2016, SanDisk Technologies LLC.

(Continued)

*Primary Examiner* — Victoria K Hall
(74) *Attorney, Agent, or Firm* — The Marbury Law Group PLLC

(57) ABSTRACT

A method of forming a device includes forming an in-process alternating stack of insulating layers and sacrificial material layers over a substrate, forming sacrificial pillar structures through the in-process alternating stack, where the sacrificial pillar structures are arranged in rows, forming inter-pillar cavities between each neighboring pair of sacrificial pillar structures, forming dielectric bridge structures by depositing a dielectric fill material in the inter-pillar cavities, selectively removing the sacrificial pillar structures to form pillar cavities, replacing remaining portions of the sacrificial material layers with electrically conductive layers through the pillar cavities, and forming pillar structures in the pillar cavities, where each of the pillar structures includes a respective vertical electrode.

9 Claims, 24 Drawing Sheets

(56) References Cited

U.S. PATENT DOCUMENTS

| | | | |
|---|---|---|---|
| 9,837,421 B2* | 12/2017 | Hsu | H01L 28/90 |
| 9,837,431 B2* | 12/2017 | Nishikawa | H01L 27/11582 |
| 9,935,124 B2* | 4/2018 | Nishikawa | H01L 27/11582 |
| 9,972,640 B1* | 5/2018 | Kai | H01L 27/11519 |
| 2010/0207194 A1* | 8/2010 | Tanaka | H01L 27/11578 257/324 |
| 2013/0043455 A1 | 2/2013 | Bateman | |
| 2013/0134377 A1* | 5/2013 | Park | H01L 45/06 257/4 |
| 2013/0285006 A1* | 10/2013 | Park | H01L 45/1206 257/5 |
| 2014/0077143 A1* | 3/2014 | Seong | H01L 45/12 257/2 |
| 2014/0361239 A1* | 12/2014 | Ramaswamy | H01L 27/249 257/5 |
| 2015/0102282 A1* | 4/2015 | Zhang | H01L 27/2454 257/5 |
| 2015/0187415 A1* | 7/2015 | Ko | H01L 45/1253 711/126 |
| 2016/0071861 A1 | 3/2016 | Serov et al. | |
| 2016/0071876 A1 | 3/2016 | Mizuno et al. | |
| 2016/0126292 A1* | 5/2016 | Yanagida | H01L 45/141 257/4 |
| 2016/0351628 A1* | 12/2016 | Okajima | H01L 27/2481 |
| 2017/0148808 A1 | 5/2017 | Nishikawa et al. | |
| 2017/0148809 A1* | 5/2017 | Nishikawa | H01L 23/528 |
| 2017/0148851 A1* | 5/2017 | Hsu | H01L 27/11514 |

OTHER PUBLICATIONS

U.S. Appl. No. 15/411,152, filed Jan. 20, 2017, SanDisk Technologies LLC.

U.S. Appl. No. 15/468,519, filed Mar. 24, 2017, SanDisk Technologies LLC.

* cited by examiner

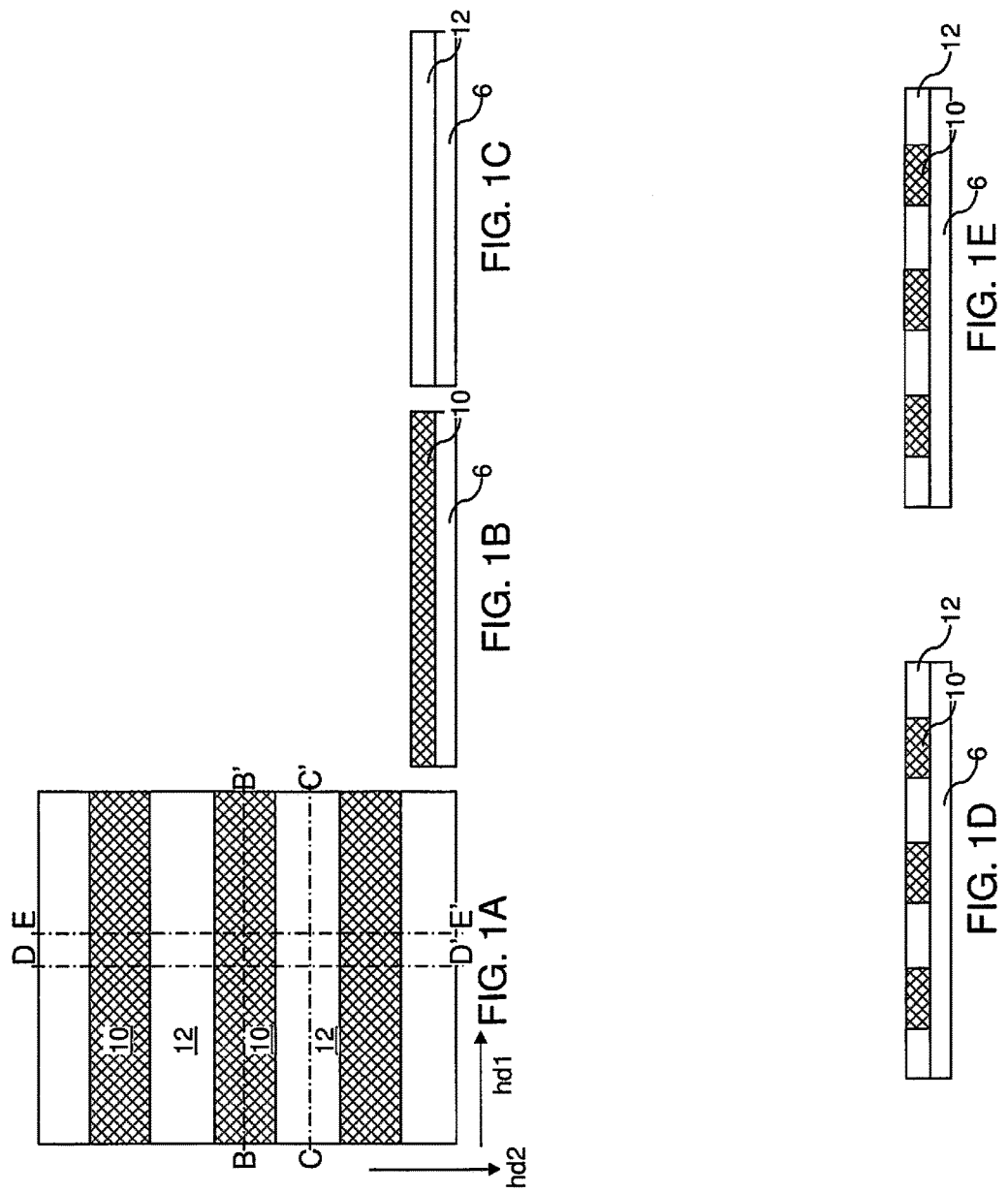

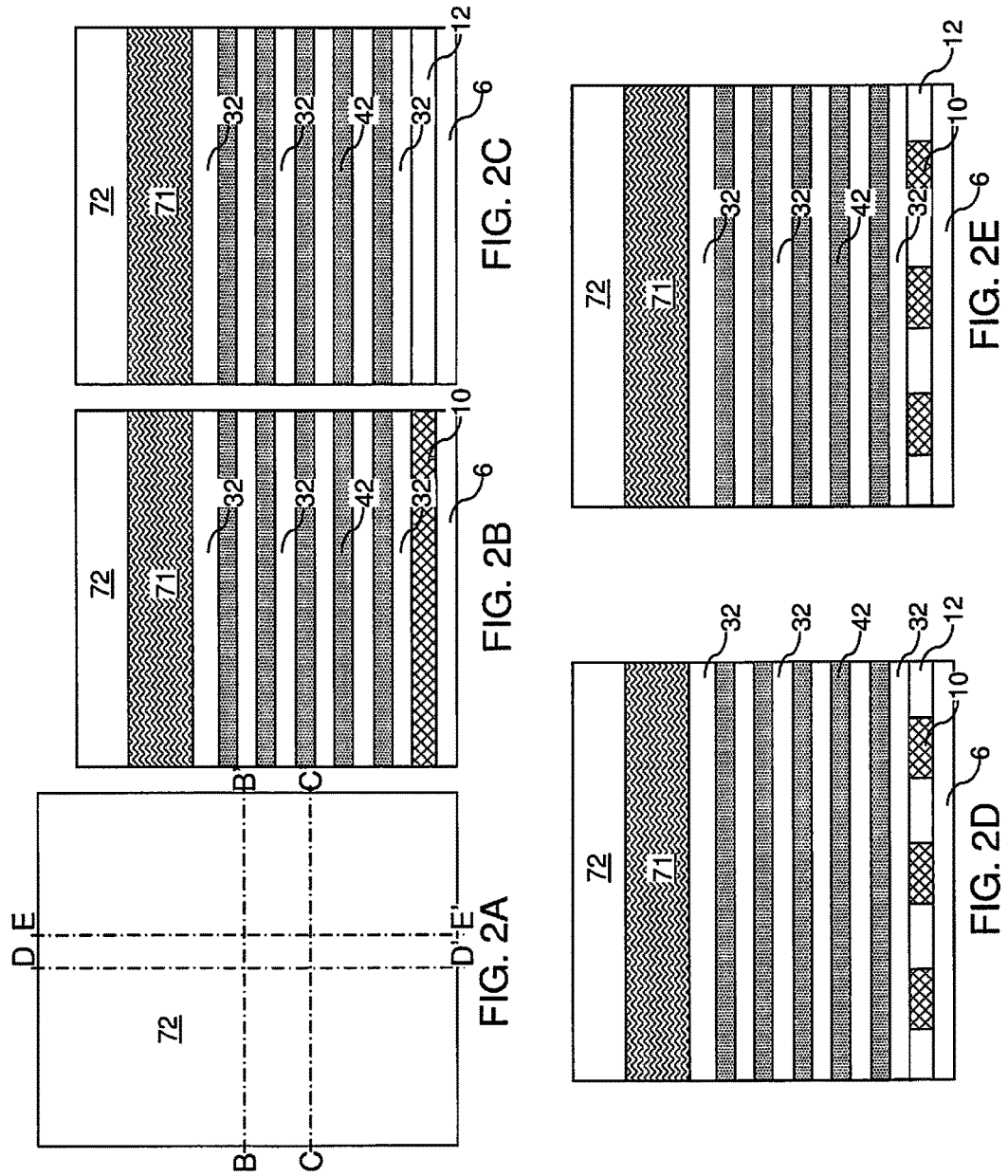

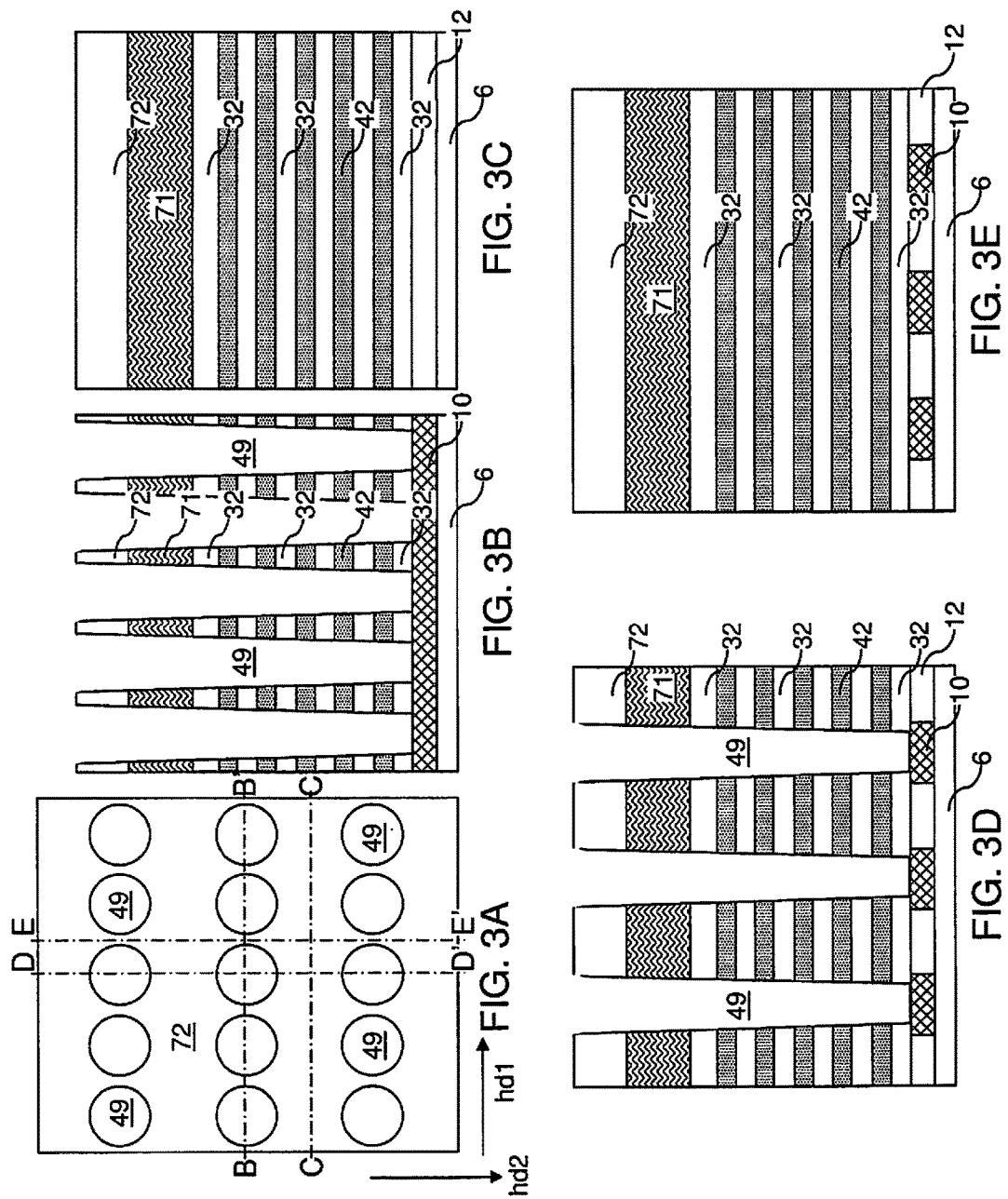

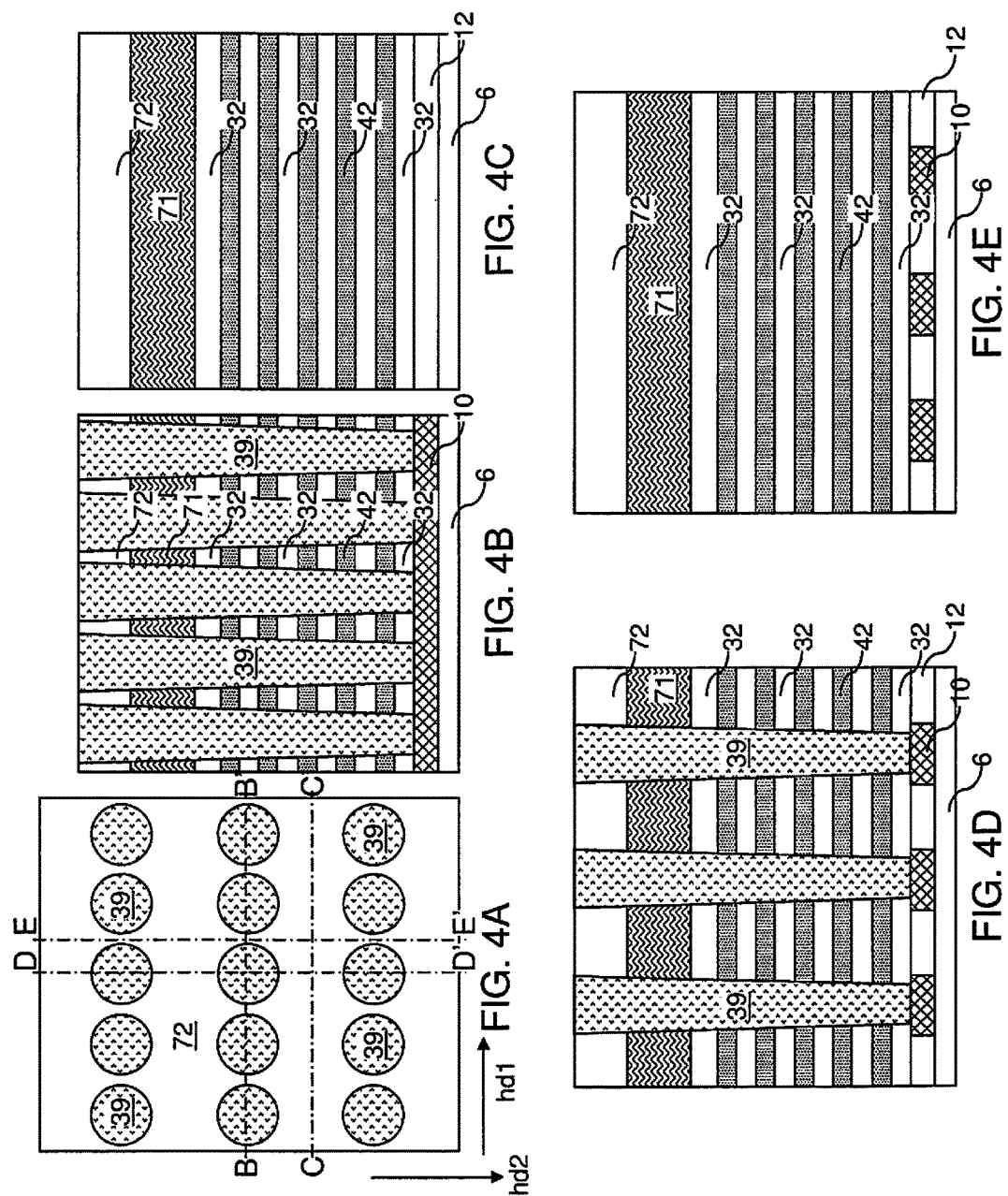

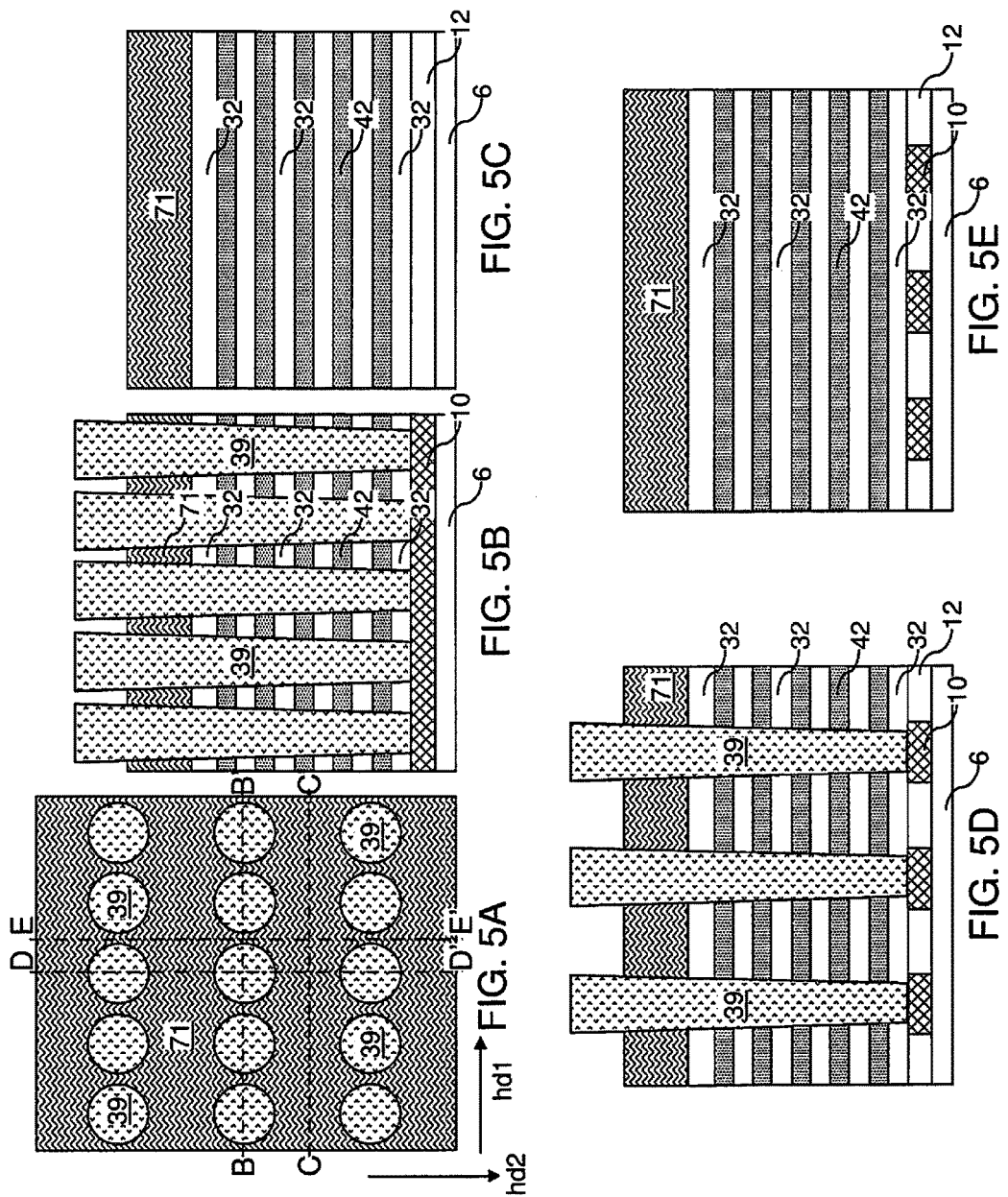

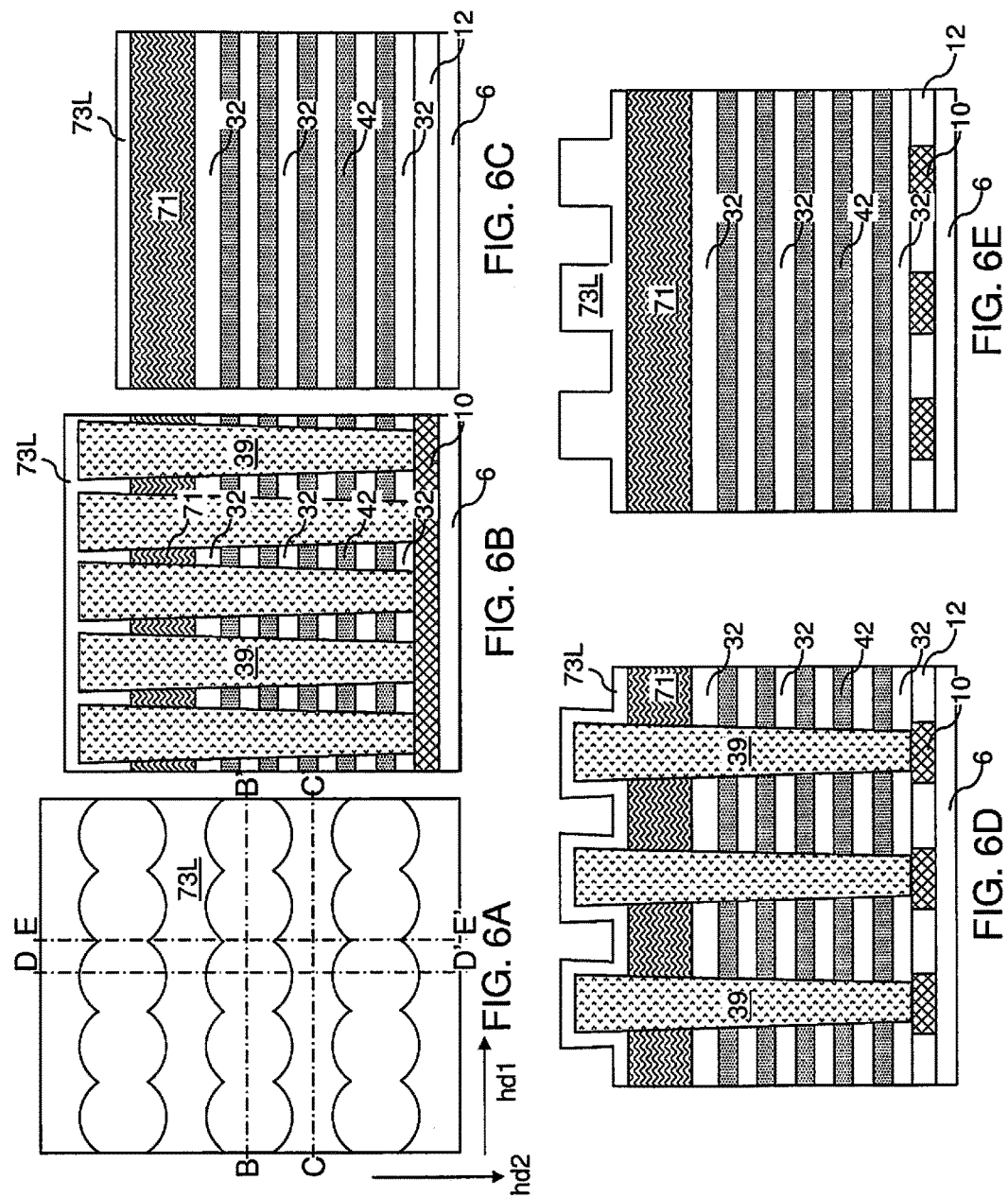

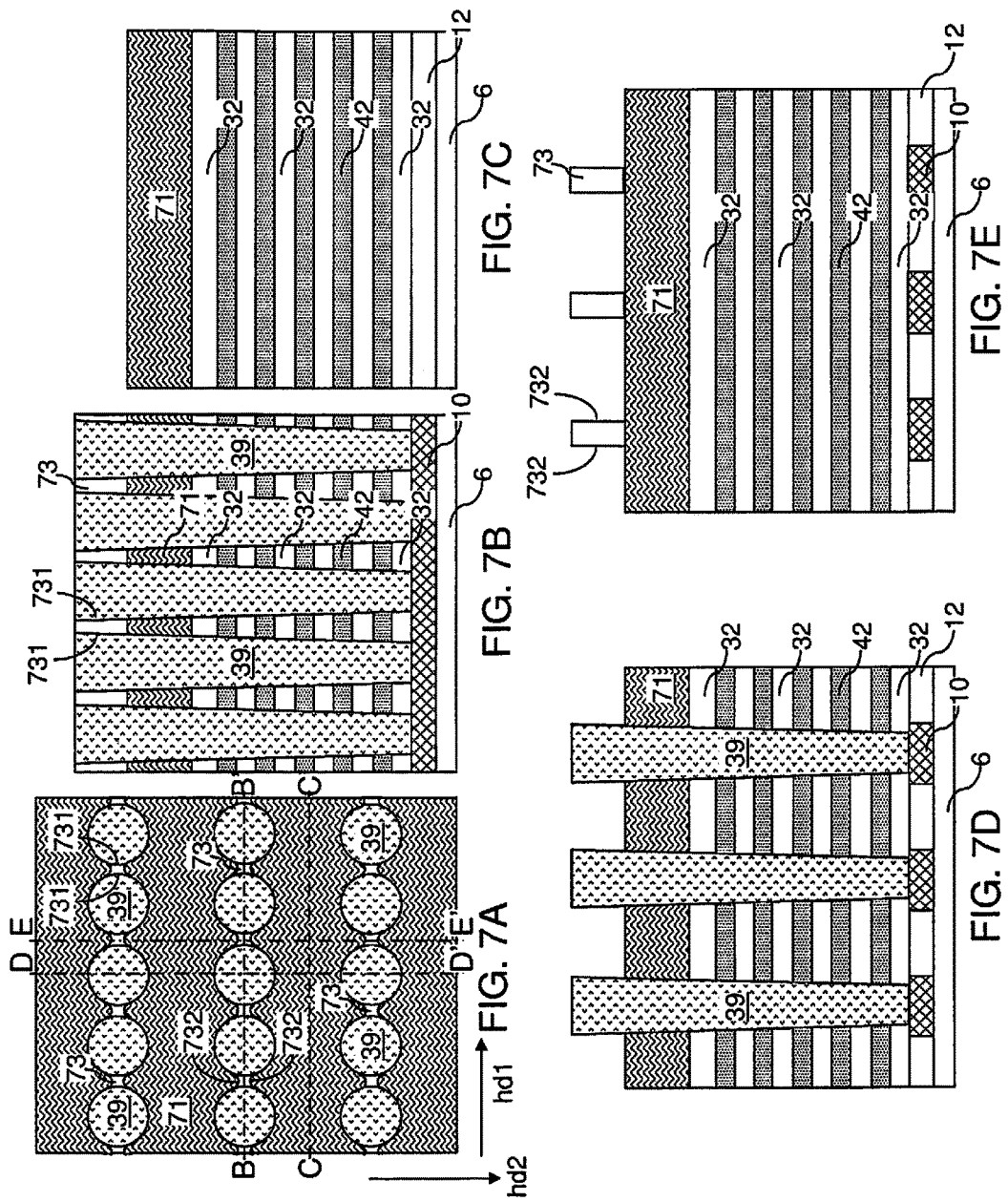

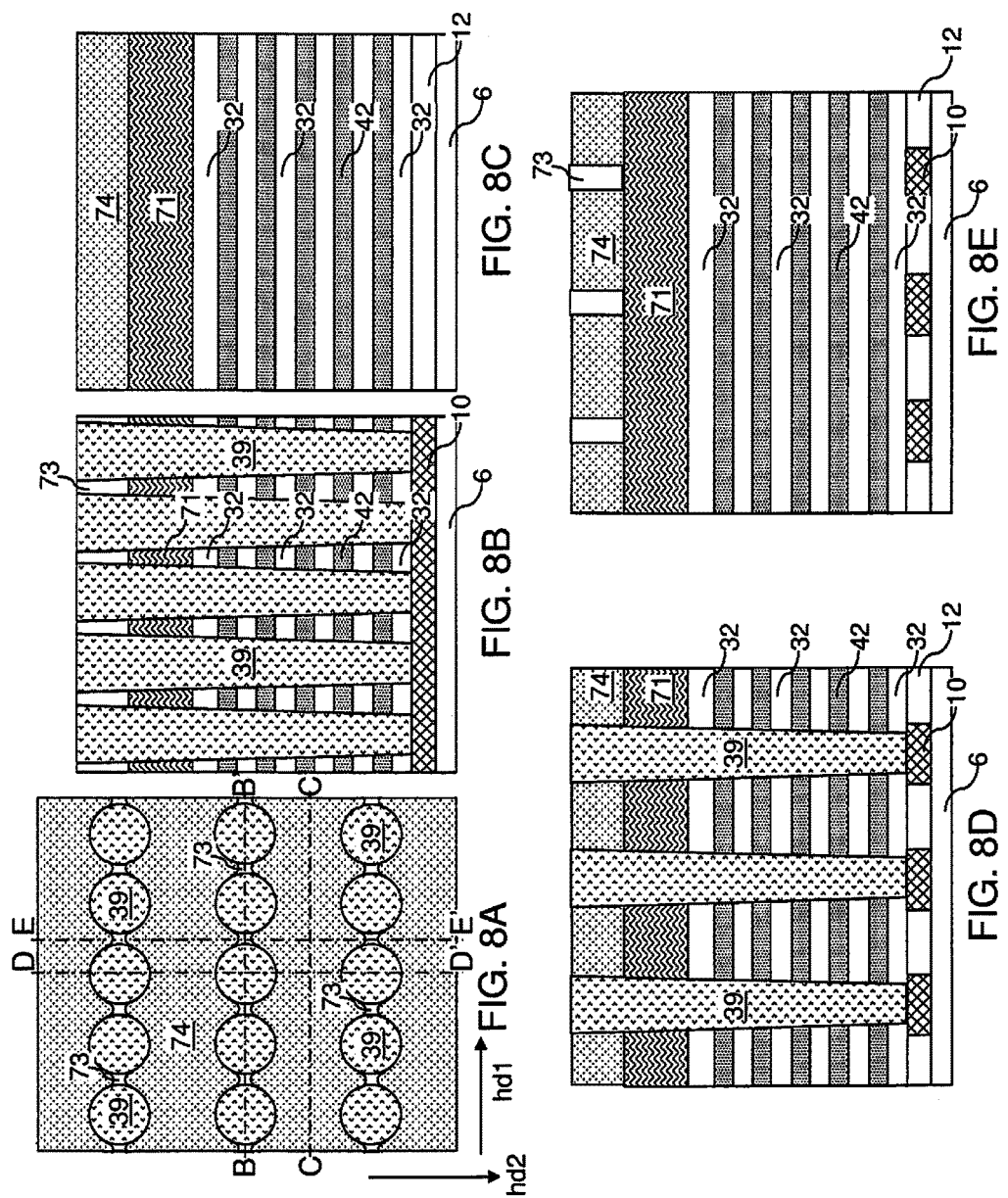

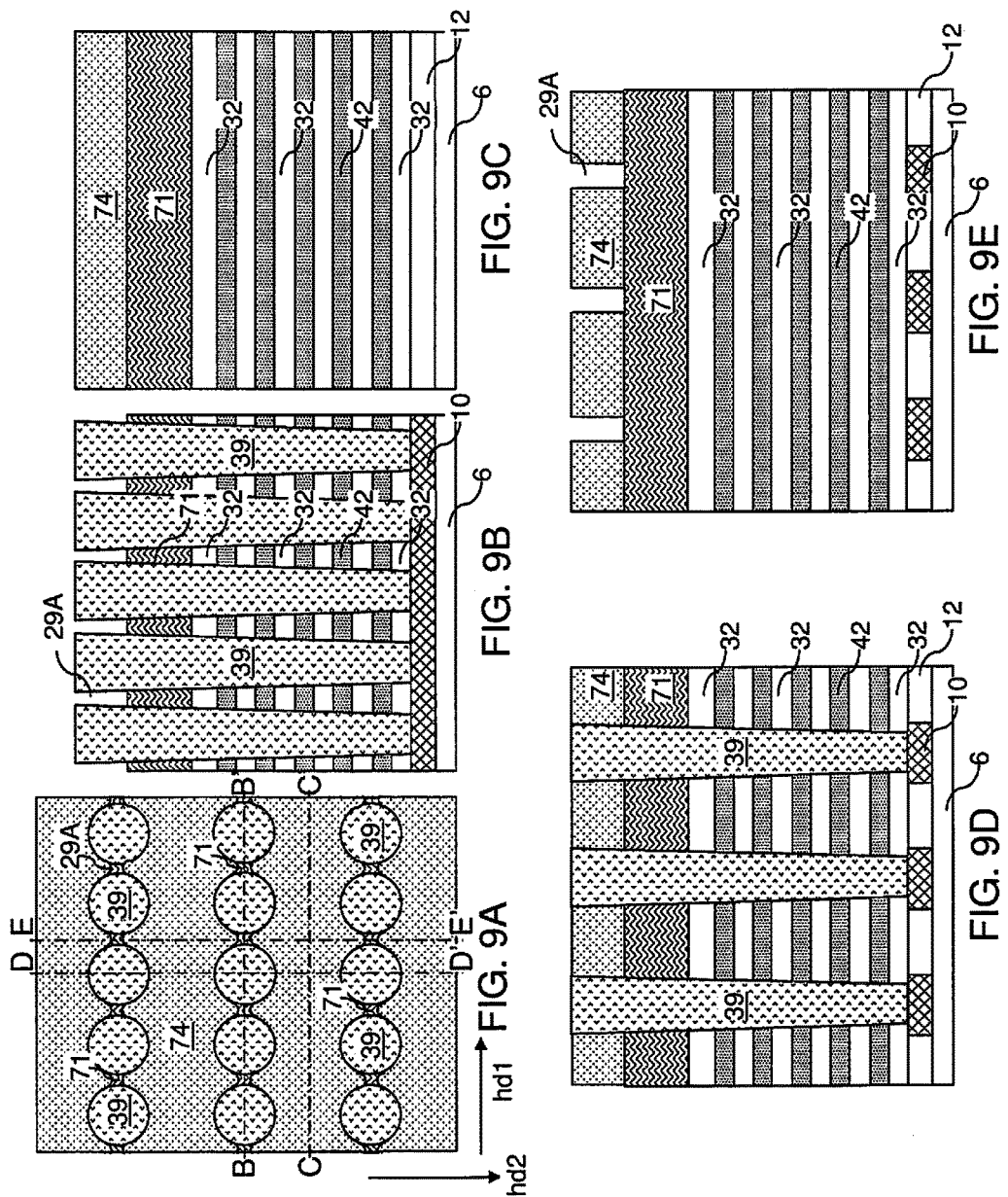

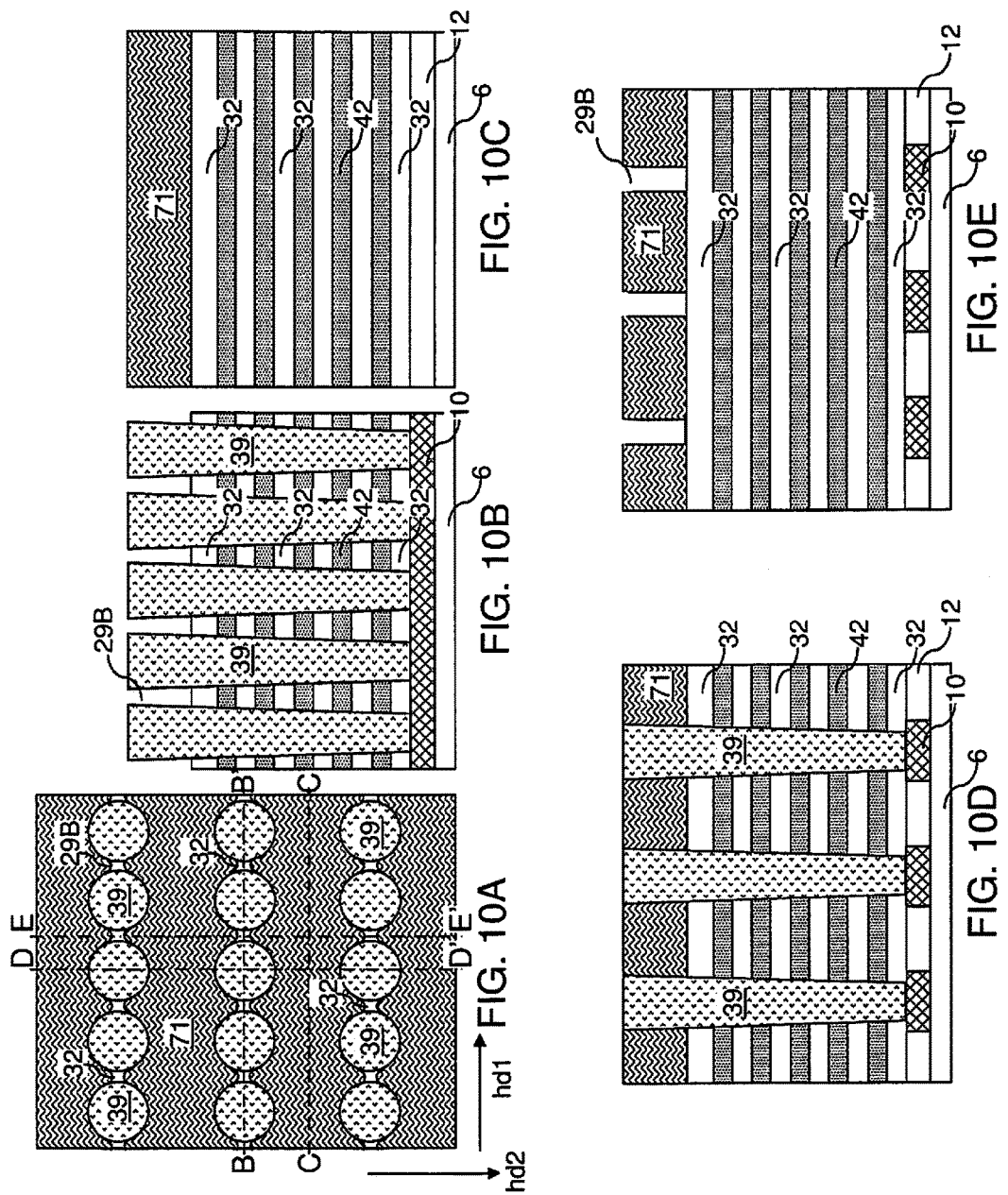

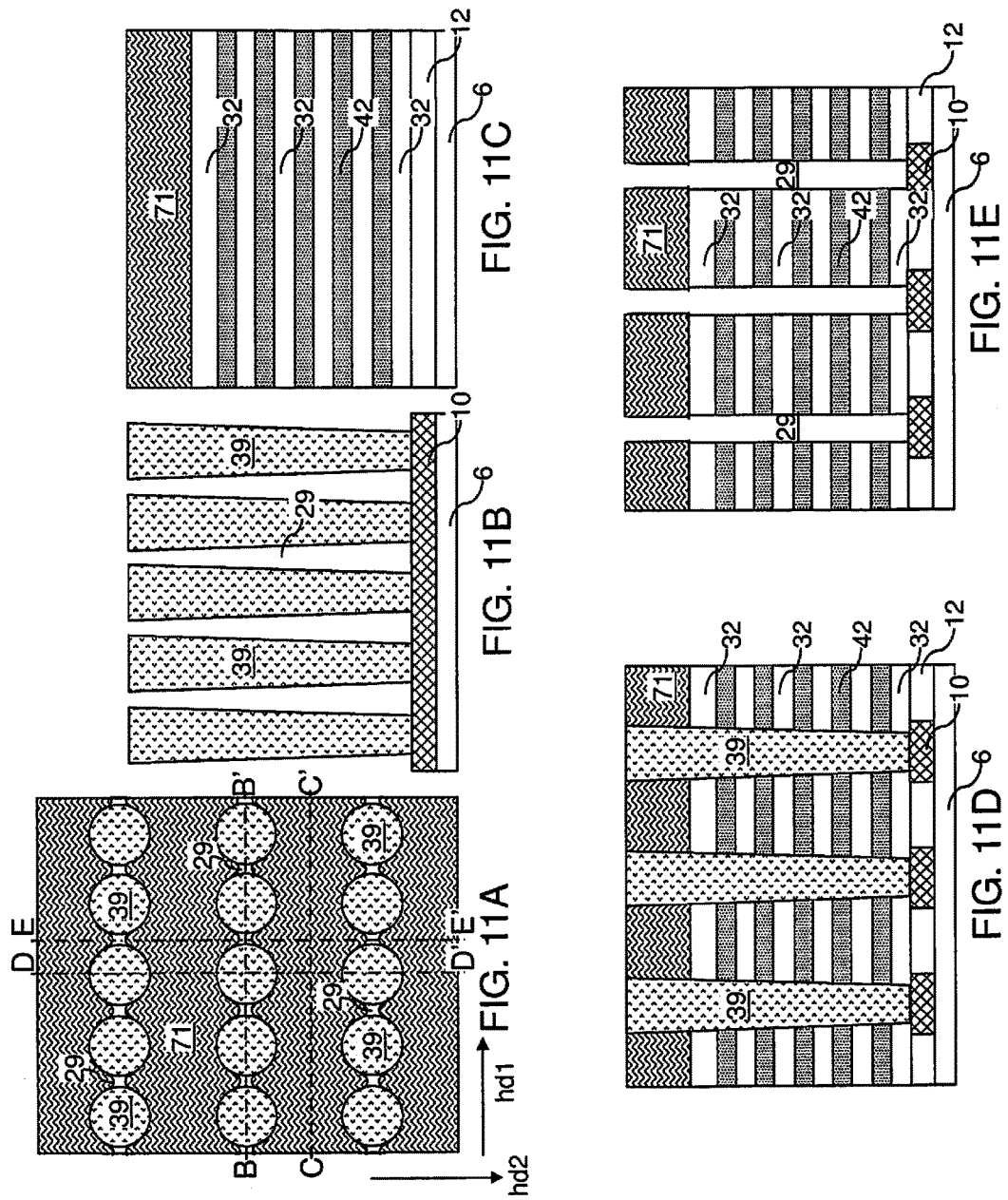

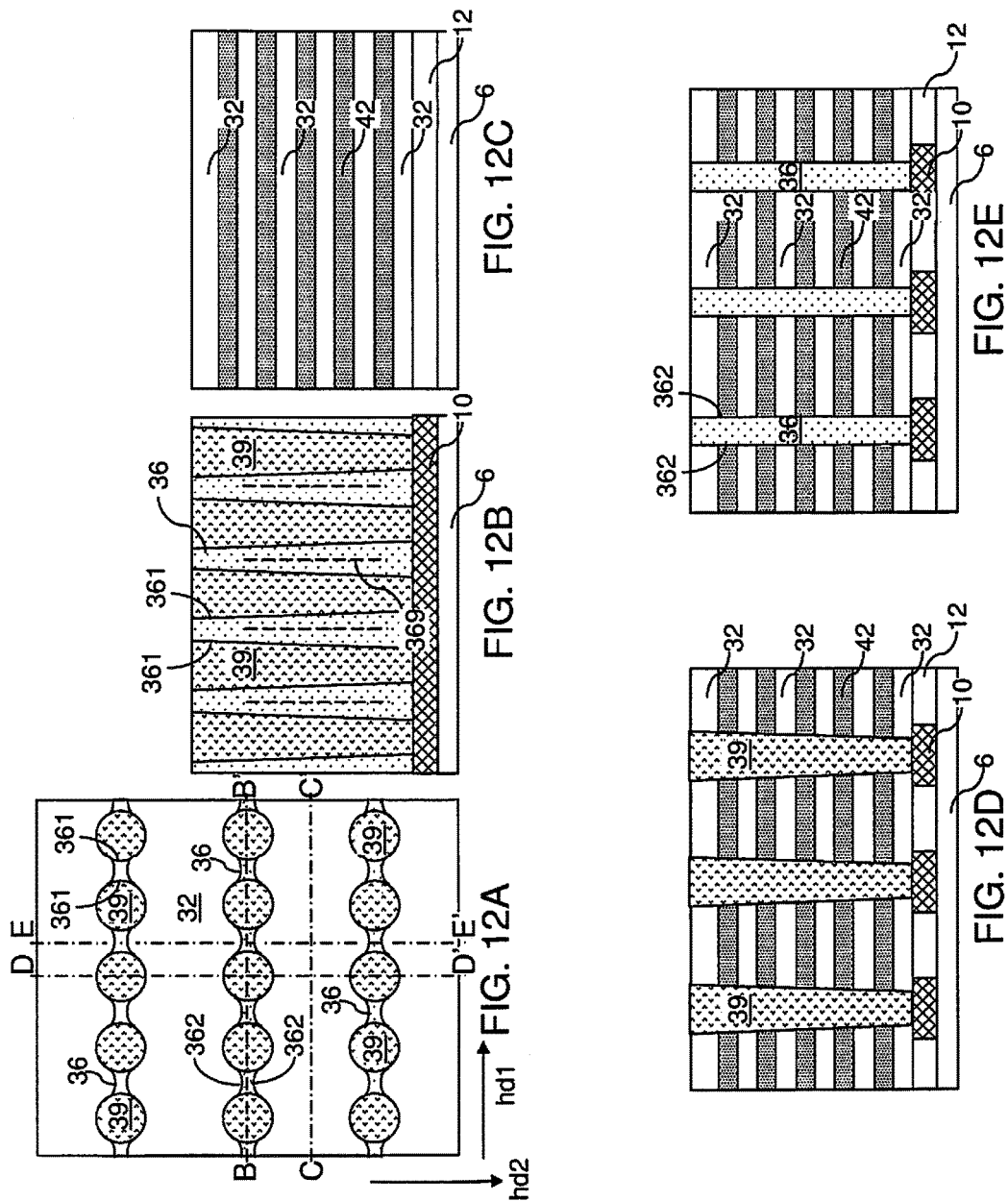

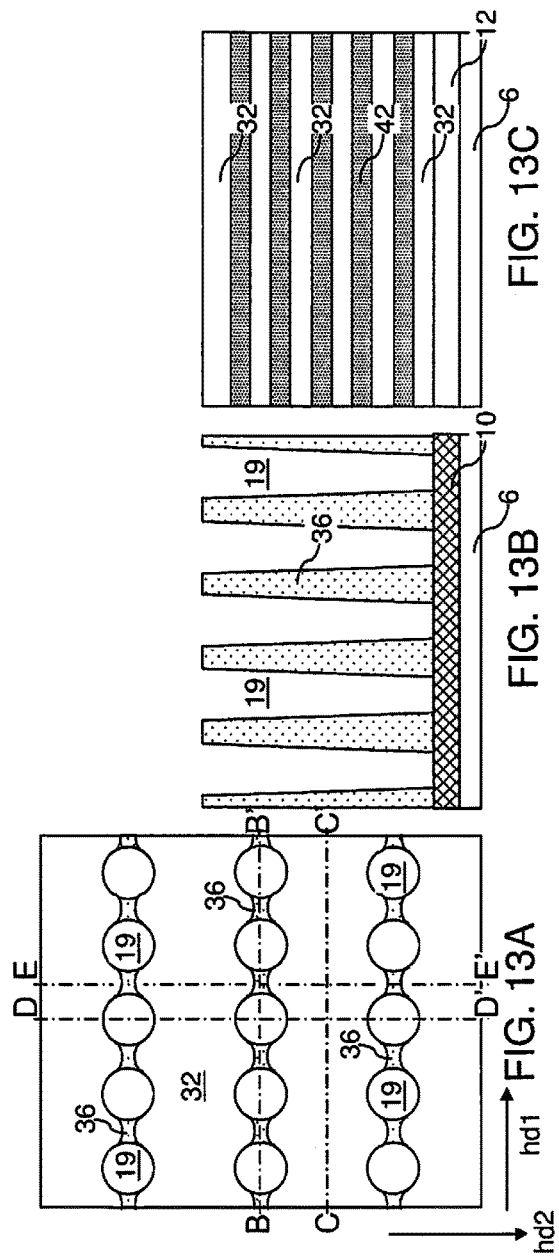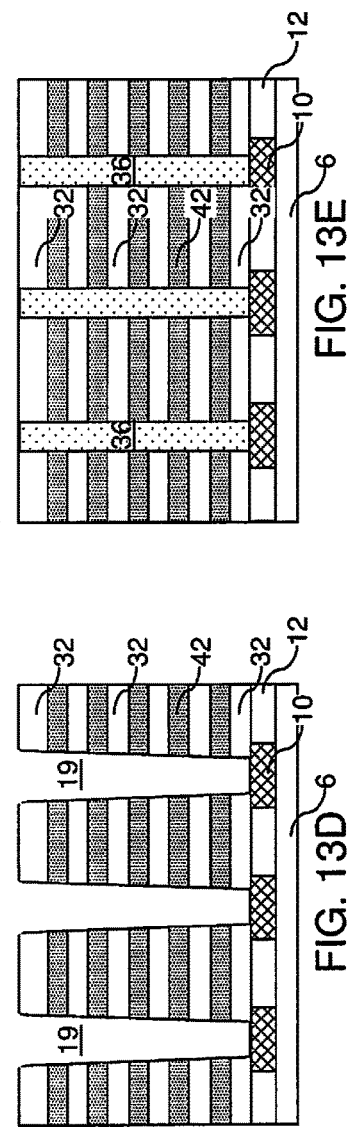

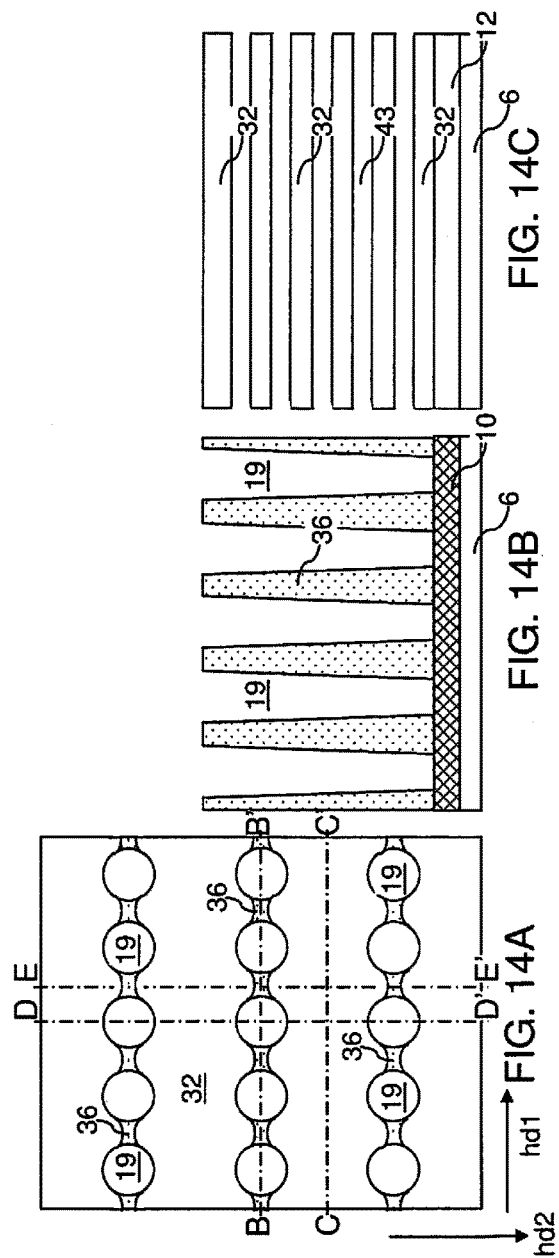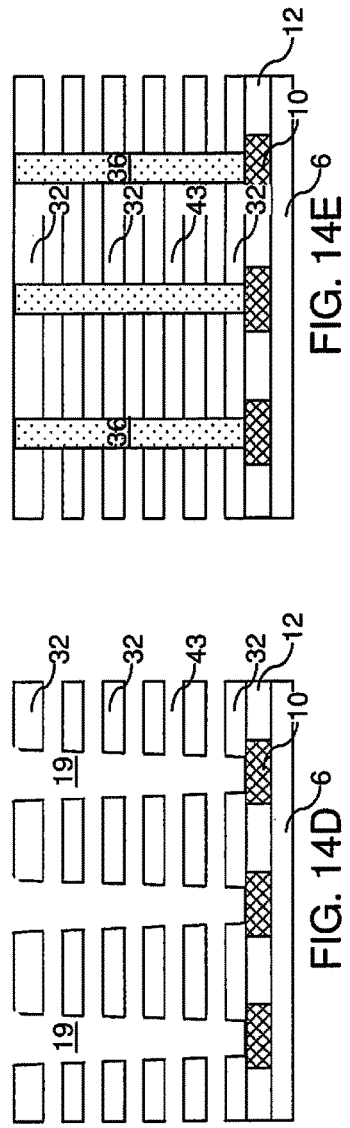

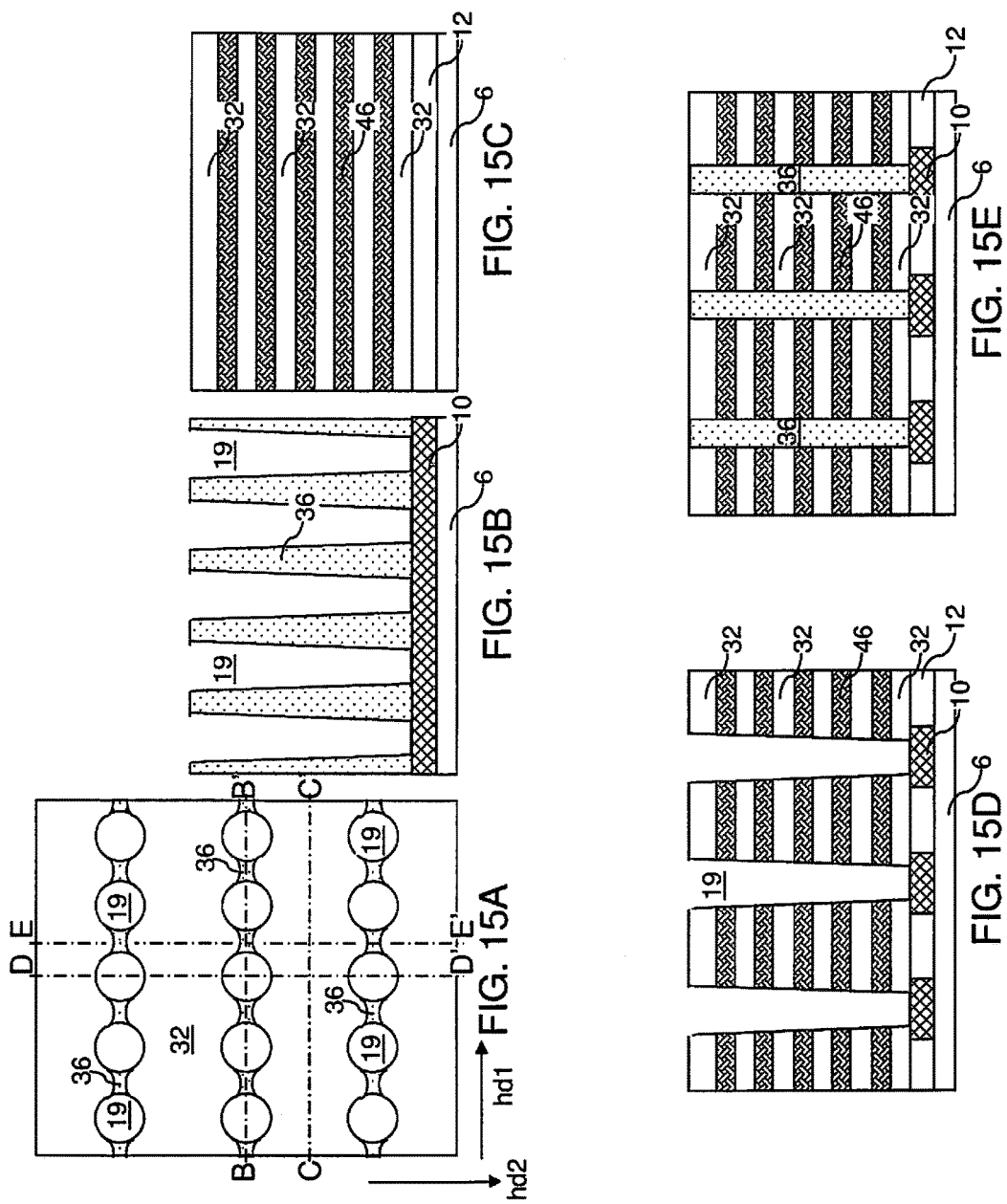

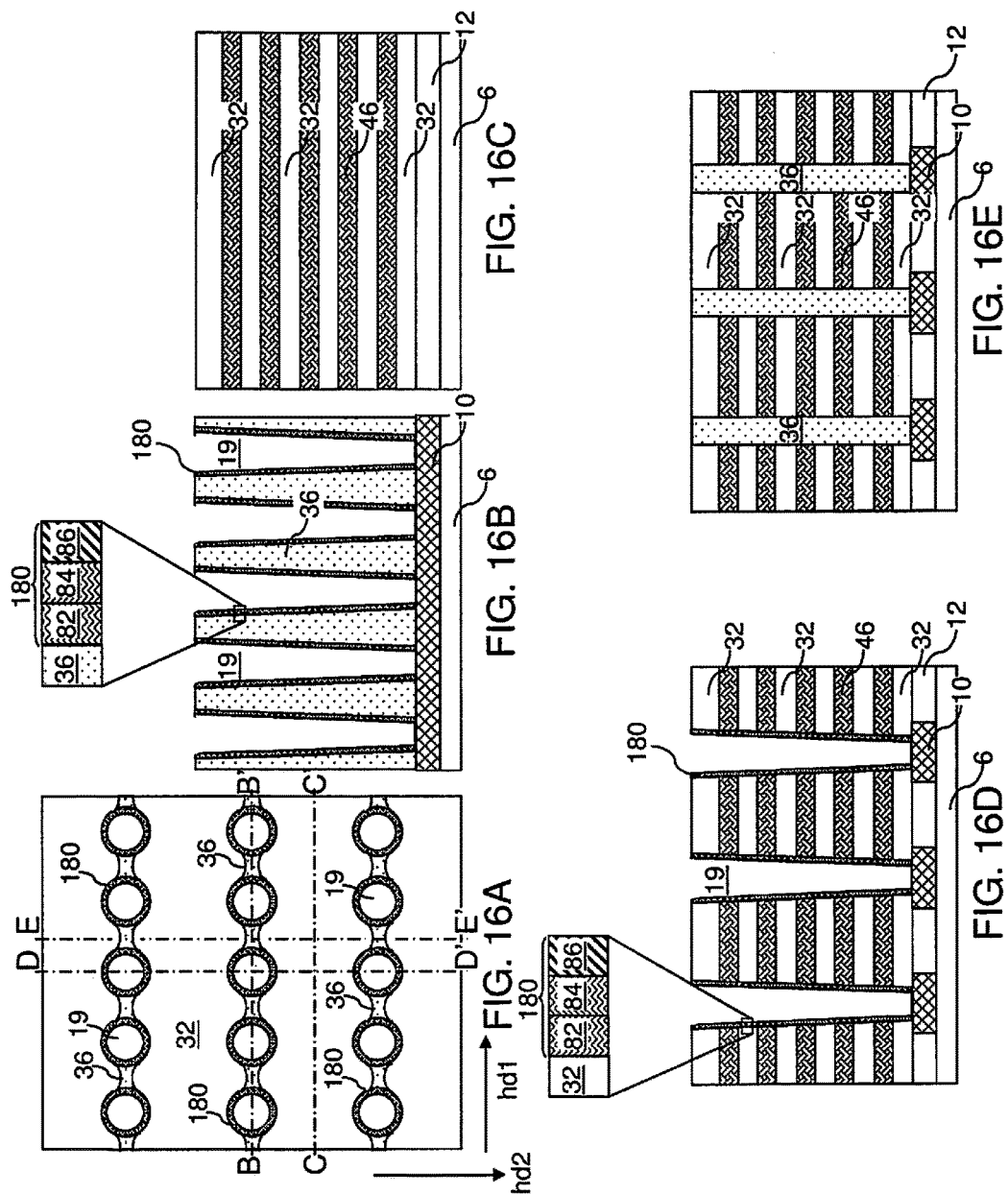

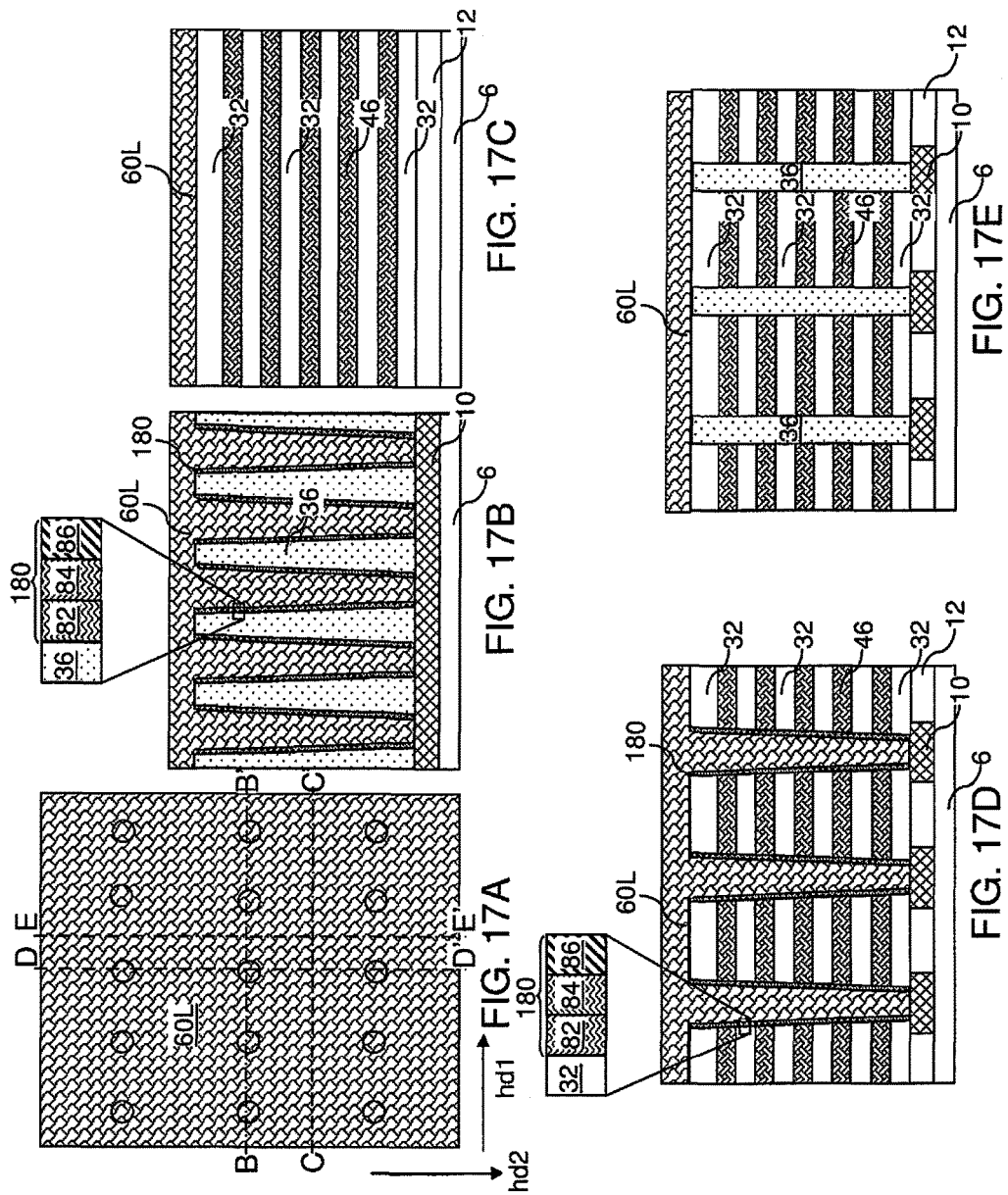

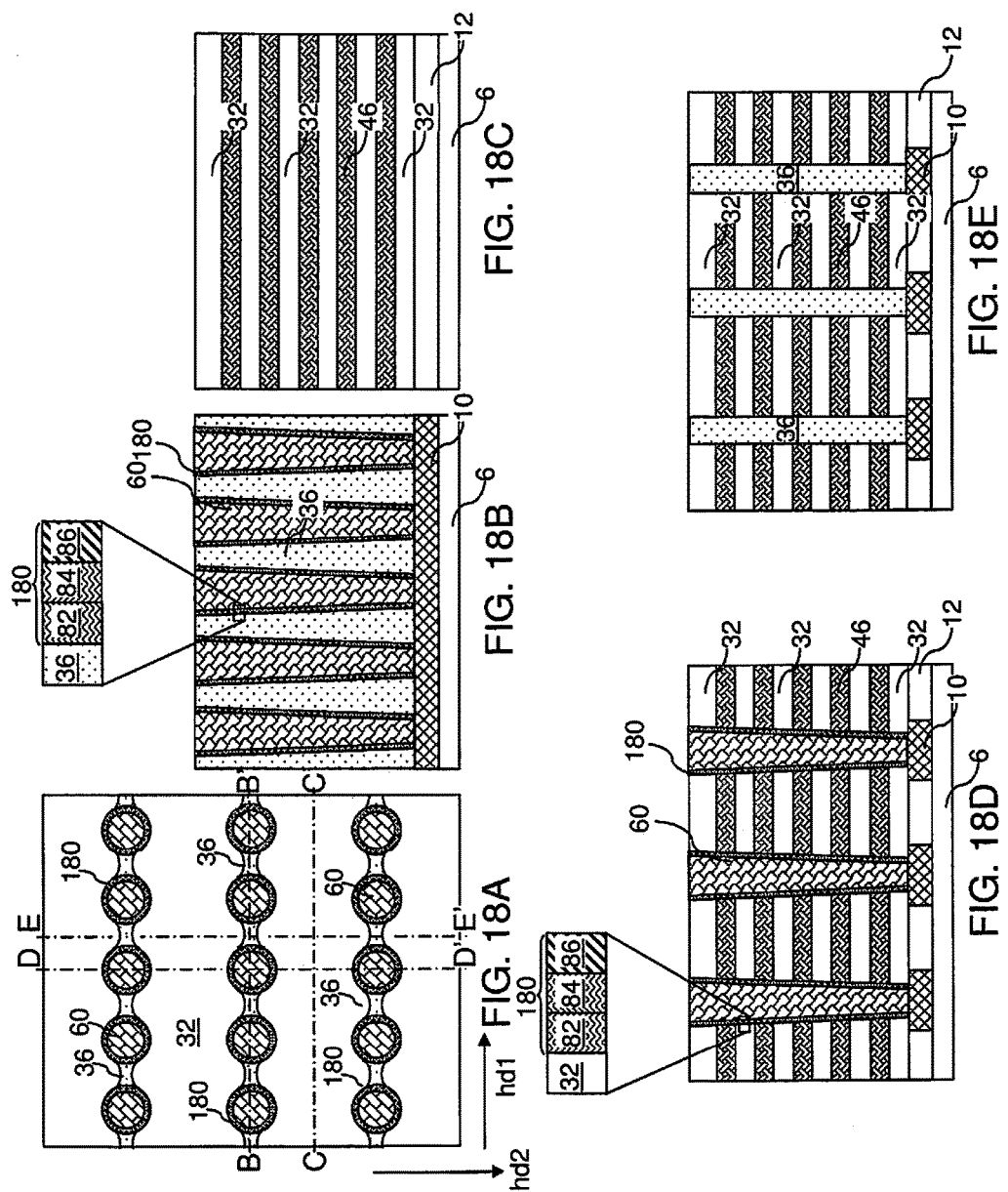

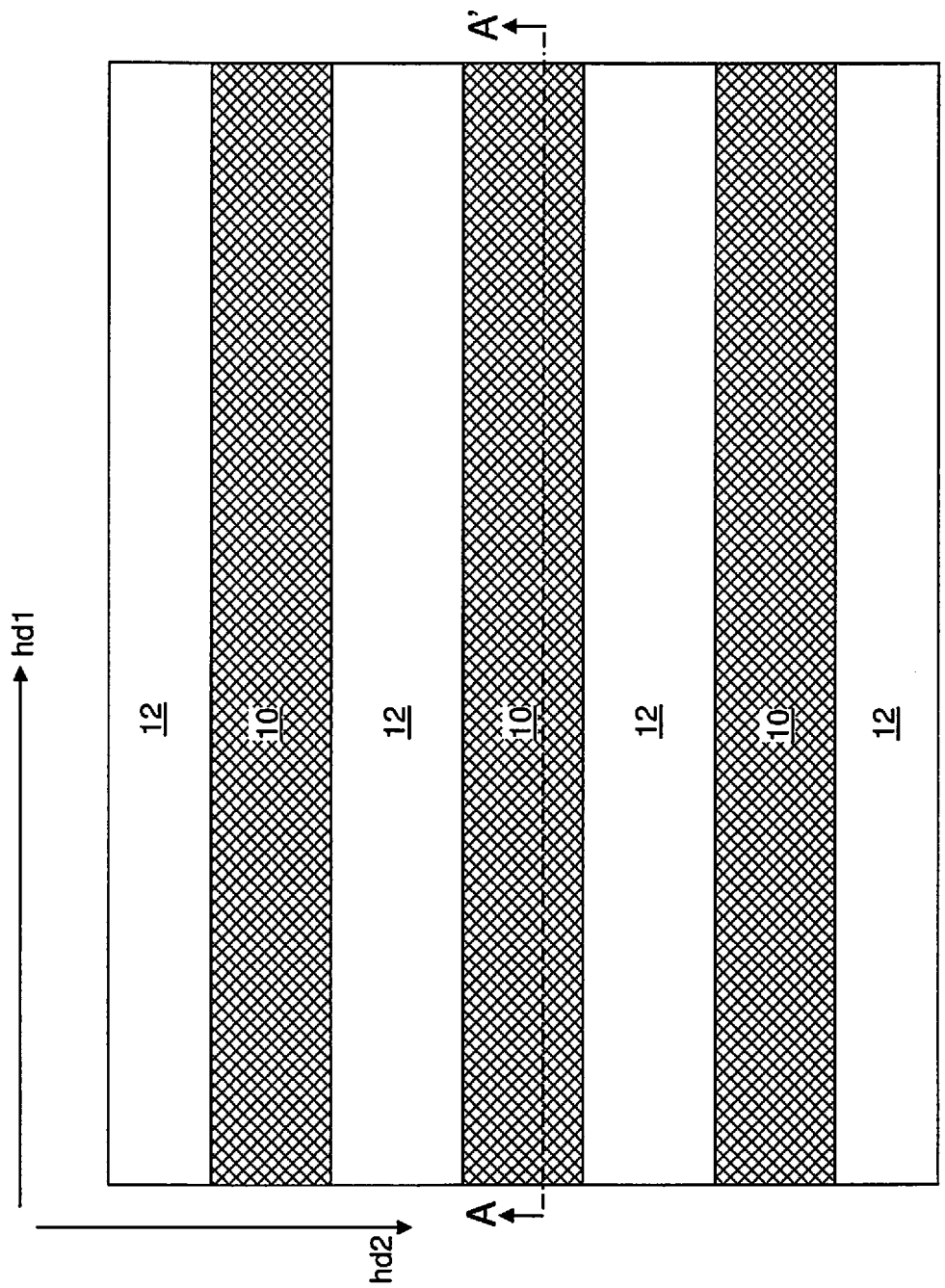

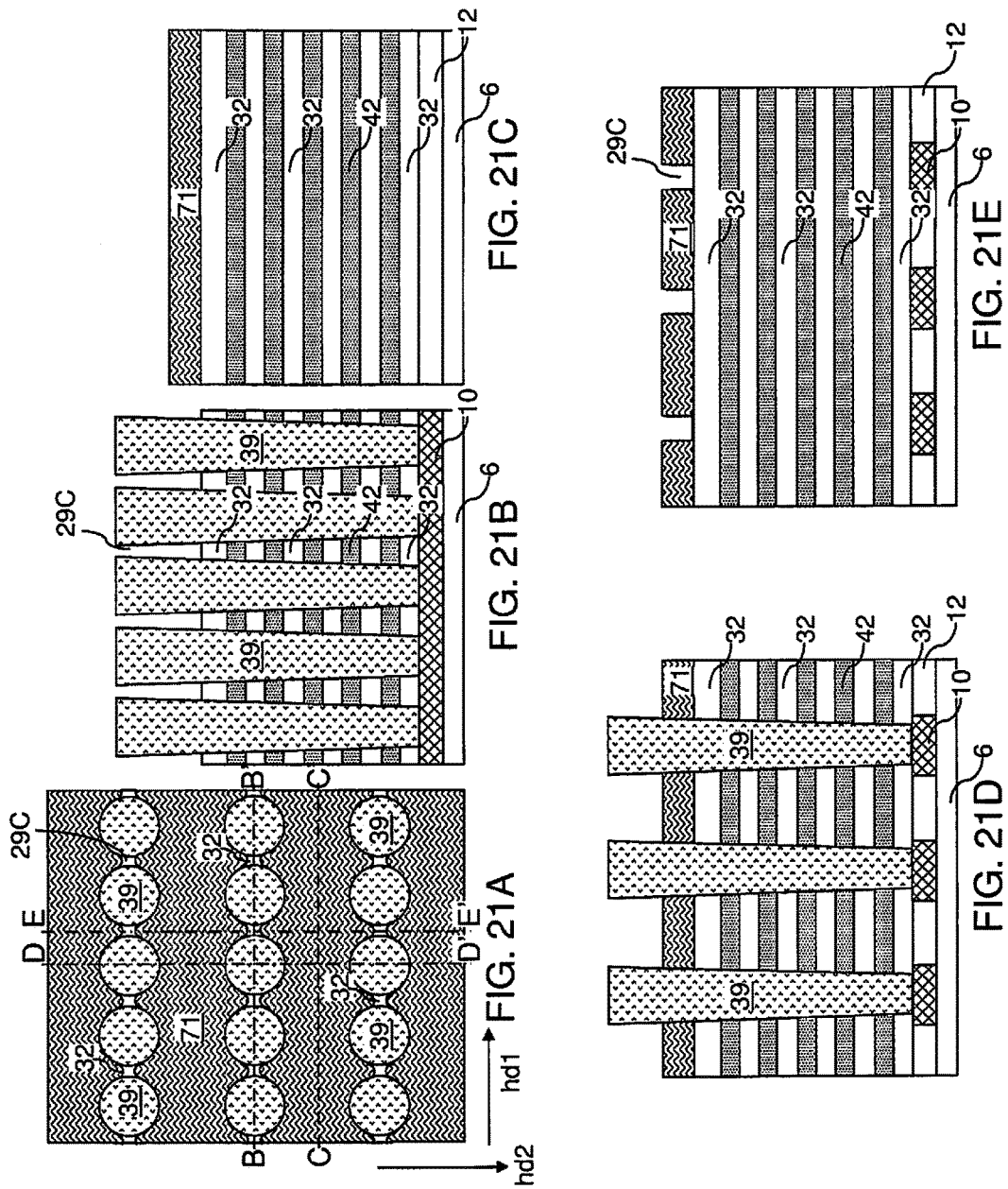

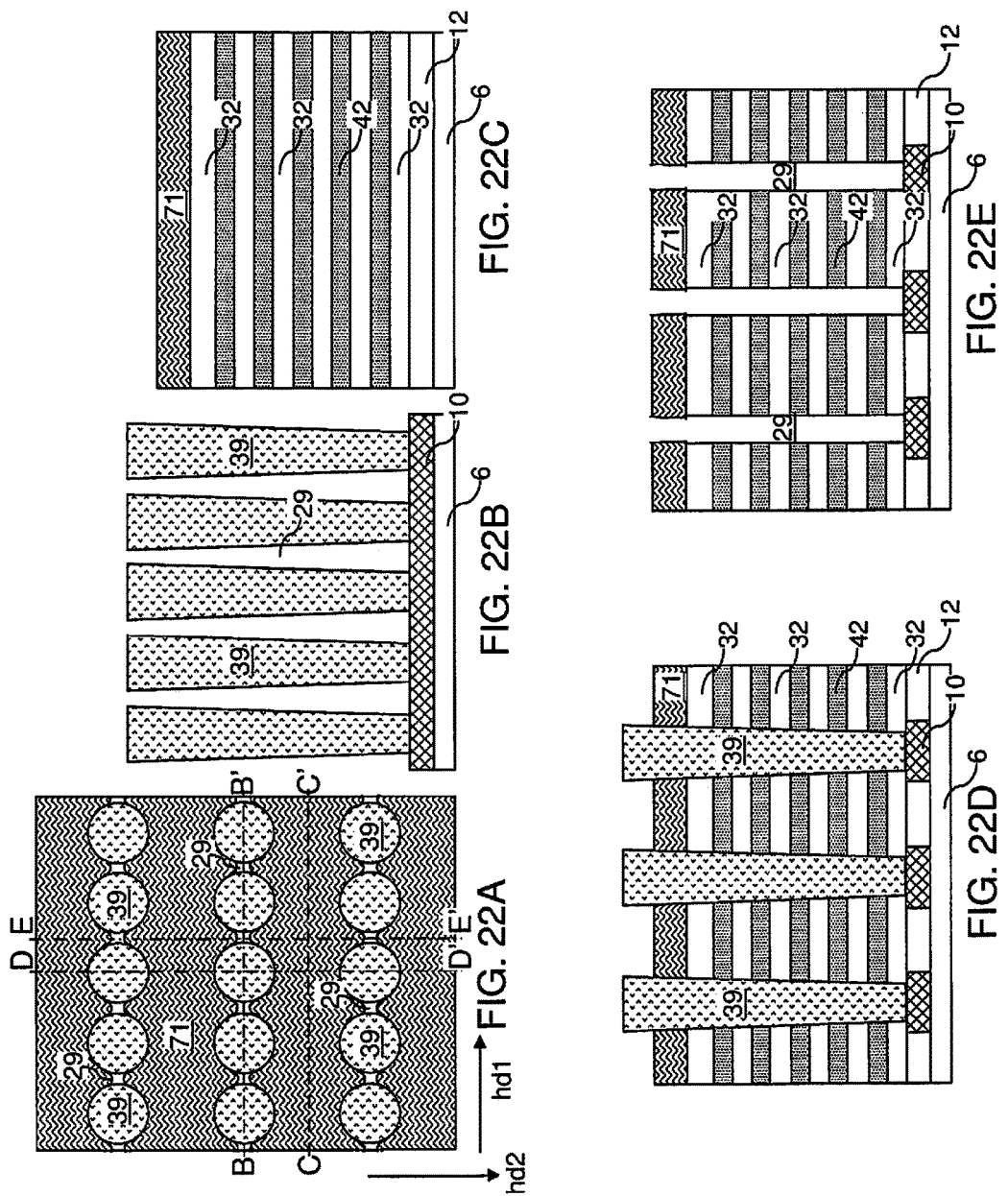

THREE-DIMENSIONAL MEMORY DEVICE WITH VERTICAL BIT LINES AND REPLACEMENT WORD LINES AND METHOD OF MAKING THEREOF

FIELD

The present disclosure relates generally to the field of semiconductor devices and specifically to three-dimensional memory devices including vertical bit lines and replacement word lines, and methods of making the same.

BACKGROUND

A resistance random access memory, or a "ReRAM," is a non-volatile memory device employing reversible change in resistance in a thin film with application of electrical voltage bias across the film. Application of the electrical voltage bias in one manner can cause a decrease in the resistance of the thin film, for example, by formation of filaments that function as leakage current paths or by increasing a crystallinity of the thin film. Application of a different type of electrical voltage bias can cause a reversal of the resistance of the thin film to an original high-resistance state, such as by removal of the filaments from the thin film or by decreasing the crystallinity of the thin film.

Thus, data can be stored in a ReRAM cell by changing the resistance of the thin film, which can be a solid-state material. The thin film is referred to as a memory film or a read/write film. Examples of ReRAM devices are described in World Intellectual Property Organization (WIPO) Publication No. WO2007004843 A1 to Hong et al. and U.S. Patent Application Publication No. 2013/0043455 A1 to Bateman.

SUMMARY

According to an aspect of the present disclosure, a three-dimensional memory device is provided, which comprises: vertically alternating stacks located over a substrate, wherein each of the vertically alternating stacks comprises insulating layers and electrically conductive layers that alternate along a vertical direction, and each of the vertically alternating stacks laterally extends along a first horizontal direction; rows of pillar structures vertically extending from topmost layers of the vertically alternating stacks to bottommost layers of the alternating stacks, wherein each of the pillar structures comprises a respective vertical electrode therein, and each row of pillar structures is located between a respective neighboring pair of vertical alternating stacks that are spaced along a second horizontal direction; memory material portions located within, or on, a respective one of the pillar structures; and dielectric bridge structures located between each neighboring pair of pillar structures.

According to another aspect of the present disclosure, a method of forming a device includes forming an in-process alternating stack of insulating layers and sacrificial material layers over a substrate, forming sacrificial pillar structures through the in-process alternating stack, where the sacrificial pillar structures are arranged in rows, forming inter-pillar cavities between each neighboring pair of sacrificial pillar structures that are spaced apart along the first horizontal direction, such that the in-process alternating stack is divided into vertically alternating stacks that are laterally spaced among one another by the sacrificial pillar structures and the inter-pillar cavities, forming dielectric bridge structures by depositing a dielectric fill material in the inter-pillar cavities, selectively removing the sacrificial pillar structures to form pillar cavities, replacing remaining portions of the sacrificial material layers with electrically conductive layers through the pillar cavities, and forming pillar structures in the pillar cavities, where each of the pillar structures comprises a respective vertical electrode.

BRIEF DESCRIPTION OF THE DRAWINGS

FIG. 1A is a top-down view of a first exemplary structure for forming a three-dimensional memory device after forming global bit lines according to a first embodiment of the present disclosure.

FIGS. 1B-1E are vertical cross-sectional views of the first exemplary structure of FIG. 1A along the vertical planes B-B', C-C', D-D', and E-E', respectively.

FIG. 2A is a top-down view of the first exemplary structure after formation of an alternating stack of insulating layers and sacrificial material layers, an etch mask layer, and a sacrificial matrix layer according to the first embodiment of the present disclosure.

FIGS. 2B-2E are vertical cross-sectional views of the first exemplary structure of FIG. 2A along the vertical planes B-B', C-C', D-D', and E-E', respectively.

FIG. 3A is a top-down view of the first exemplary structure after formation of memory openings according to the first embodiment of the present disclosure.

FIGS. 3B-3E are vertical cross-sectional views of the first exemplary structure of FIG. 3A along the vertical planes B-B', C-C', D-D', and E-E', respectively.

FIG. 4A is a top-down view of the first exemplary structure after formation of sacrificial pillar structures in the memory openings according to the first embodiment of the present disclosure.

FIGS. 4B-4E are vertical cross-sectional views of the first exemplary structure of FIG. 4A along the vertical planes B-B', C-C', D-D', and E-E', respectively.

FIG. 5A is a top-down view of the first exemplary structure after removal of the sacrificial matrix layer according to the first embodiment of the present disclosure.

FIGS. 5B-5E are vertical cross-sectional views of the first exemplary structure of FIG. 5A along the vertical planes B-B', C-C', D-D', and E-E', respectively.

FIG. 6A is a top-down view of the first exemplary structure after deposition of a conformal material layer according to the first embodiment of the present disclosure.

FIGS. 6B-6E are vertical cross-sectional views of the first exemplary structure of FIG. 6A along the vertical planes B-B', C-C', D-D', and E-E', respectively.

FIG. 7A is a top-down view of the first exemplary structure after formation of sacrificial bridge structures according to the first embodiment of the present disclosure.

FIGS. 7B-7E are vertical cross-sectional views of the first exemplary structure of FIG. 7A along the vertical planes B-B', C-C', D-D', and E-E', respectively.

FIG. 8A is a top-down view of the first exemplary structure after formation of a patterned mask layer according to the first embodiment of the present disclosure.

FIGS. 8B-8E are vertical cross-sectional views of the first exemplary structure of FIG. 8A along the vertical planes B-B', C-C', D-D', and E-E', respectively.

FIG. 9A is a top-down view of the first exemplary structure after selective removal of the sacrificial bridge structures according to the first embodiment of the present disclosure.

FIGS. 9B-9E are vertical cross-sectional views of the first exemplary structure of FIG. 9A along the vertical planes B-B', C-C', D-D', and E-E', respectively.

FIG. 10A is a top-down view of the first exemplary structure after transfer of a pattern of openings through the etch mask layer according to the first embodiment of the present disclosure.

FIGS. 10B-10E are vertical cross-sectional views of the first exemplary structure of FIG. 10A along the vertical planes B-B', C-C', D-D', and E-E', respectively.

FIG. 11A is a top-down view of the first exemplary structure after transfer of a pattern in the etch mask layer though the alternating stack according to the first embodiment of the present disclosure.

FIGS. 11B-11E are vertical cross-sectional views of the first exemplary structure of FIG. 11A along the vertical planes B-B', C-C', D-D', and E-E', respectively.

FIG. 12A is a top-down view of the first exemplary structure after formation of dielectric bridge structures and removal of the etch mask layer according to the first embodiment of the present disclosure.

FIGS. 12B-12E are vertical cross-sectional views of the first exemplary structure of FIG. 12A along the vertical planes B-B', C-C', D-D', and E-E', respectively.

FIG. 13A is a top-down view of the first exemplary structure after removal of the sacrificial pillar structures according to the first embodiment of the present disclosure.

FIGS. 13B-13E are vertical cross-sectional views of the first exemplary structure of FIG. 13A along the vertical planes B-B', C-C', D-D', and E-E', respectively.

FIG. 14A is a top-down view of the first exemplary structure after formation of lateral recesses by removal of the sacrificial material layers according to the first embodiment of the present disclosure.

FIGS. 14B-14E are vertical cross-sectional views of the first exemplary structure of FIG. 14A along the vertical planes B-B', C-C', D-D', and E-E', respectively.

FIG. 15A is a top-down view of the first exemplary structure after formation of electrically conductive layers in the lateral recesses according to the first embodiment of the present disclosure.

FIGS. 15B-15E are vertical cross-sectional views of the first exemplary structure of FIG. 15A along the vertical planes B-B', C-C', D-D', and E-E', respectively.

FIG. 16A is a top-down view of the first exemplary structure after formation of memory-material-containing layer stacks in the memory openings according to the first embodiment of the present disclosure.

FIGS. 16B-16E are vertical cross-sectional views of the first exemplary structure of FIG. 16A along the vertical planes B-B', C-C', D-D', and E-E', respectively.

FIG. 17A is a top-down view of the first exemplary structure after deposition of an electrode layer according to the first embodiment of the present disclosure.

FIGS. 17B-17E are vertical cross-sectional views of the first exemplary structure of FIG. 17A along the vertical planes B-B', C-C', D-D', and E-E', respectively.

FIG. 18A is a top-down view of the first exemplary structure after formation of vertical electrodes according to the first embodiment of the present disclosure.

FIGS. 18B-18E are vertical cross-sectional views of the first exemplary structure of FIG. 18A along the vertical planes B-B', C-C', D-D', and E-E', respectively.

FIGS. 19B and 19C are horizontal cross-sectional views of the second exemplary structure of FIG. 19A.

FIG. 21A is a top-down view of an alternate configuration of the first exemplary structure after etching portions of the etch mask layer located at narrow gaps between sacrificial pillar structures employing a microloading effect according to the first embodiment of the present disclosure.

FIGS. 21B-21E are vertical cross-sectional views of the alternate configuration of the first exemplary structure of FIG. 21A along the vertical planes B-B', C-C', D-D', and E-E', respectively.

FIG. 22A is a top-down view of the alternate configuration of the first exemplary structure after transfer of a pattern in the etch mask layer though the alternating stack according to the first embodiment of the present disclosure.

FIGS. 22B-22E are vertical cross-sectional views of the first exemplary structure of FIG. 22A along the vertical planes B-B', C-C', D-D', and E-E', respectively.

DETAILED DESCRIPTION

Figure 19A:
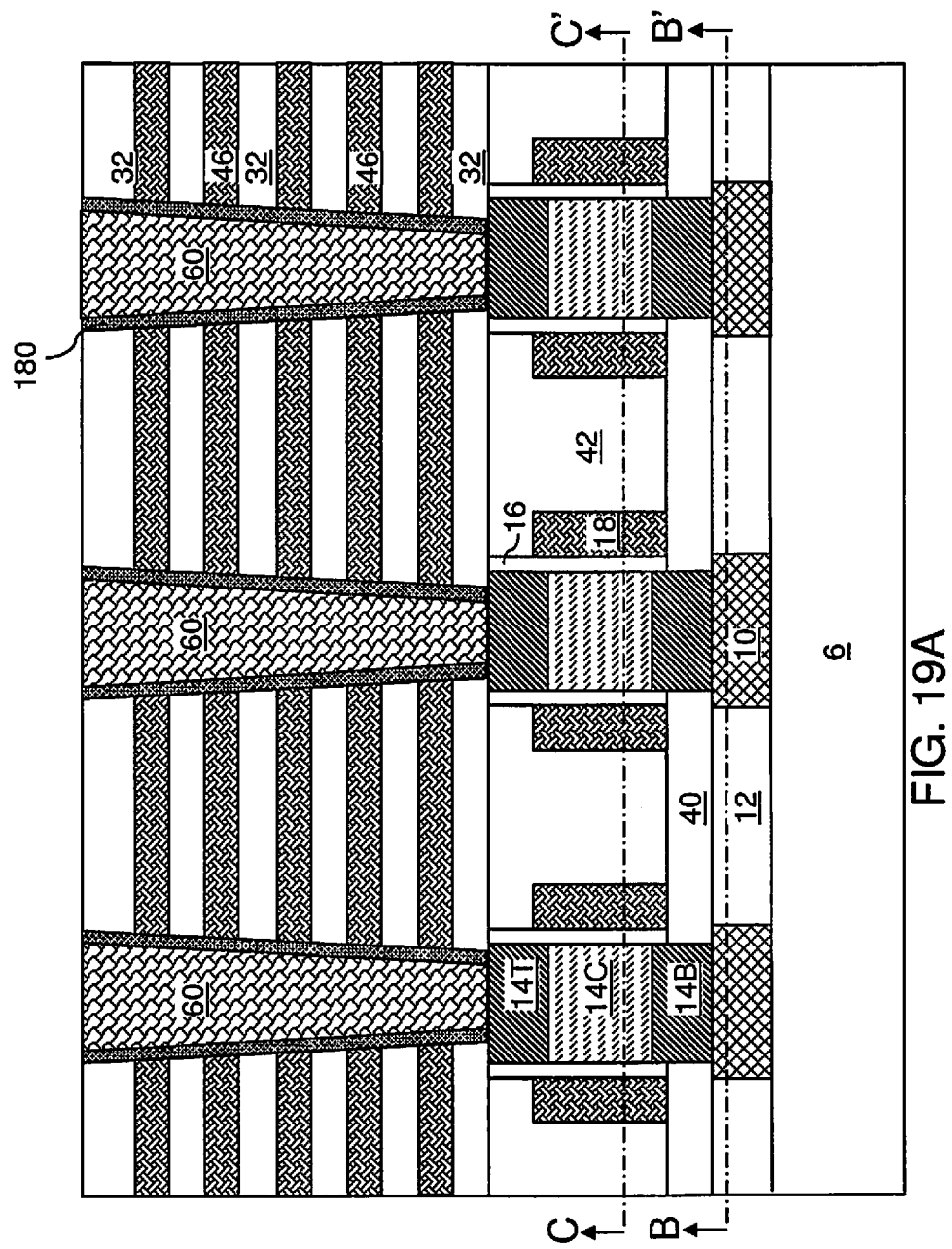
FIG. 19A is a vertical cross-sectional view of a second exemplary structure according to a second embodiment of the present disclosure.

As discussed above, the present disclosure is directed to three-dimensional memory devices including vertical bit lines and replacement word lines, and methods of making the same, the various aspects of which are described below. The embodiments of the disclosure can be employed to form various semiconductor devices including at least one resistive memory element. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure.

As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, and/or may have one or more layer thereupon, thereabove, and/or therebelow.

As used herein, a "layer stack" refers to a stack of layers. As used herein, a "line" or a "line structure" refers to a layer that has a predominant direction of extension, i.e., having a direction along which the layer extends the most.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure.

As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm.

As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

As used herein, a "resistive memory material" is a material of which the resistivity can be altered by application of a voltage across the material. As used herein, a "resistive memory element" refers to an element that includes a portion of a resistive memory material in a configuration that enables programming of the resistive memory material into at least two states having different values of electrical resistance.

A monolithic three dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two-dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three Dimensional Structure Memory." The substrates may be thinned or removed from the memory levels before bonding, but as the memory levels are initially formed over separate substrates, such memories are not true monolithic three dimensional memory arrays.

Referring to FIGS. 1A-1E, a first exemplary structure for forming a three-dimensional memory device is illustrated, which can be an in-process ReRAM device. As used herein, a "prototype" structure or an "in-process" structure refers to a transient structure that is subsequently modified in the shape or composition of at least one component therein.

The first exemplary structure includes a substrate 6, which includes an insulating layer at an upper portion thereof. In one embodiment, the substrate 6 can be a stack of at least two material layers such as a stack of an underlying substrate material layer and an overlying substrate insulating layer. The substrate material layer can be a semiconductor material layer, a conductive material layer, or an insulating material layer that can provide structural support to the overlying structures, and may have a thickness greater than 50 microns, and typically in a range between 300 microns and 3 mm In one embodiment, the substrate material layer can be a semiconductor wafer, such as a silicon wafer as known in the art. The substrate insulating layer can include an insulating material, and can have a thickness in a range from 100 nm to 3 microns, although lesser and greater thicknesses can also be employed.

In case the substrate material layer includes a semiconductor material, peripheral semiconductor devices for operation of a memory array device can be formed in, or on, the substrate material layer. For example, sense circuitry (e.g., sense amplifier), input-output (I/O) circuitry, control circuitry, and any other necessary peripheral circuitry can be formed on, or in, the substrate material layer. Additional devices that can be formed in, or on, the substrate material layer include, but are not limited to, global bit line select transistors for selecting global bit lines to be activated, local bit line select transistors for selecting local bit lines to be activated, and word line select transistor for selecting word lines to be activated. Metal interconnect structures and/or dielectric material layers may be formed in an upper portion of the substrate 6.

Global bit lines 10 are formed over the substrate 6. The global bit lines 10 are parallel electrically conductive lines extending in a first horizontal direction hd1 and are laterally spaced apart in a second horizontal direction hd2. The global bit lines 10 can be formed, for example, by depositing at least one conductive material layer, and patterning the at least one conductive material layer employing a combination of lithographic methods and an anisotropic etch. The at least one conductive material layer may include a planar doped semiconductor material layer having a doping of a first conductivity type, and may include one or more underlying metallic material layers in addition to or instead of the planar doped semiconductor material layer. Each of the one or more underlying metallic material layers can include, for example, at least one elemental metal (such as W, Co, Cu, and Al), an intermetallic alloy including at least two elemental metals, a conductive metallic nitride, or a conductive metallic carbide. For example, the at least one conductive material layer can include an optional metallic barrier layer (such as a layer of TiN, TaN, or WN), an optional metal layer (such as a layer of W, Ti, Ta, Cu, Al, or an alloy thereof), and a planar doped semiconductor material layer. In this case, each global bit line 10 can include an optional metallic rail and a doped semiconductor rail. In one embodiment, each global bit line 10 can laterally extend along a first horizontal direction hd1, and can have a uniform width throughout along a second horizontal direction hd2 that is perpendicular to the first horizontal direction hd1. In one embodiment, the global bit lines 10 can form a one-dimensional array that is repeated along the second horizontal direction hd2 with a periodicity.

The space between the global bit lines 10 can be filled with a dielectric material (such as silicon oxide). The dielectric material can be subsequently planarized to remove excess portions from above a horizontal plane including the top surfaces of the global bit lines 10 to form separator dielectric material portions 12. Each global bit lines 10 and each separator dielectric material portions 12 can extend along the first horizontal direction hd1. A one-dimensional array of the global bit lines 10 and the separator dielectric material portions 12 can extend along the second horizontal direction hd2 with a periodicity that is equal to the sum of the width of a global bit line 10 and the width of a separator dielectric material portion 12. Alternatively, the one-dimensional array of the global bit lines 10 and the separator dielectric material portions 12 may be formed by depositing a dielectric material layer, forming trenches extending along the first horizontal direction hd1 and laterally spaced from one another along the second horizontal direction hd2, and filling the trenches with at least one conductive material to form the global bit lines 10 therein.

Referring to FIGS. 2A-2E, an alternating stack of insulating layers 32 and sacrificial material layers 42 can be formed over the global bit lines 10 and the separator dielectric material portions 12. The alternating stack may start with a bottommost insulating layer 32 and terminate with a topmost insulating layer 32. The sacrificial material layers 42 are subsequently replaced with electrically conductive layers that function as word lines of the three-dimensional memory device. As such, the sacrificial material layers 42 include a material that can be removed selective to the material of the insulating layers 32. In one embodiment, the insulating layers 32 can include undoped silicate glass (e.g., silicon oxide) or doped silicate glass. All of the insulating layers 32 can include the same dielectric material such as a silicate glass. The topmost insulating layer 32 can include the same material as the insulating layers 32, or can include a different material (such as silicon nitride or a dielectric metal oxide) from the material of the insulating layers 32. The sacrificial material layers 42 can include a sacrificial material such as silicon nitride, amorphous carbon, diamond-like carbon (DLC), or an amorphous or polycrystalline semiconductor material (such as germanium, a silicon-germanium alloy, or silicon).

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of the electrically conductive layers and the insulating layers may begin with an instance of the electrically conductive layers or with an instance of the insulating layers, and may terminate with an instance of the electrically conductive layers or with an instance of the insulating layers. In one embodiment, an instance of the first elements and an instance of the second elements may form a unit that is repeated with periodicity within the alternating plurality.

The thickness of the sacrificial material layers 42 can be in a range from 10 nm to 100 nm, although lesser and greater thicknesses can also be employed. The thickness of the insulating layers 32 can be in a range from 10 nm to 100 nm, although lesser and greater thicknesses can also be employed. The thickness of the topmost insulating layer 32 can be in a range from 10 nm to 300 nm, although lesser and greater thicknesses can also be employed.

A pair of a sacrificial material layer 42 and an insulating layer 32 can constitute a unit of repetition in the alternating stack (32, 42) of the sacrificial material layers 42 and the insulating layers 32. The total number of repetitions can be in a range from 8 to 1,024, although lesser and greater number of repetitions can also be employed. The alternating stack (32, 42) is an in-process alternating stack of insulating layers 32 and sacrificial material layers 42 that are subsequently modified.

An etch mask layer 71 can be formed over the alternating stack (32, 42) as a planar material layer. The etch mask layer 71 includes a material that can be employed as a hard mask for subsequently etching the materials of the insulating layers 32 and the sacrificial material layers 42. For example, the etch mask layer 71 can include a semiconductor material such as polysilicon. The etch mask layer 71 can be deposited as a planar material layer (i.e., an unpatterned blanket material layer), and can have a thickness in a range from 50 nm to 500 nm, although lesser and greater thicknesses can also be employed.

A sacrificial matrix layer 72 is subsequently deposited over the etch mask layer 71. The sacrificial matrix layer 72 includes a sacrificial material that can be removed selective to the material of the etch mask layer 71. For example, the sacrificial matrix layer 72 can include a dielectric material such as silicon oxide or silicon nitride. The thickness of the sacrificial matrix layer can be in a range from 50 nm to 500 nm, although lesser and greater thicknesses can also be employed.

Referring to FIGS. 3A-3E, a photoresist layer (not shown) can be applied over the sacrificial matrix layer 72, and can be lithographically patterned to form discrete openings therein. The discrete openings can be laterally spaced among one another without merging. In one embodiment, the discrete openings in the photoresist layer can be arranged as a two dimensional array that is repeated along the first horizontal direction hd1 and along the second horizontal direction hd2. In one embodiment, the openings through the photoresist layer can be arranged as rows of openings that extend along the first horizontal direction hd1 such that the rows are repeated along the second horizontal direction hd2 (e.g., the openings can form columns that extend in direction hd2). The nearest neighbor spacing of the openings along the first horizontal direction hd1 can be less than the nearest neighbor spacing of the openings along the second horizontal direction hd2. If the openings are arranged in rows and columns, then the column spacing (i.e., pitch) is smaller than the row spacing (i.e., pitch). For example, the nearest neighbor spacing along the first horizontal direction hd1 can be in a range from 5 nm to 50 nm (such as from 10 nm to 30 nm), and the nearest neighbor spacing along the second horizontal direction hd2 can be in a range from 30 nm to 300 nm (such as from 50 nm to 150 nm). In one embodiment, each row of openings extending along the first horizontal direction hd1 can overlie a respective one of the global bit lines 10.

An anisotropic etch is performed to etch the materials of the sacrificial matrix layer 72, the etch mask layer 71, and the alternating stack (32, 42). The pattern of the openings in the photoresist layer can be transferred through the sacrificial matrix layer 72, the etch mask layer 71, and the alternating stack (32, 42) to form memory openings 49. The global bit lines 10 can be employed as an etch stop structure. A top surface of a respective one of the global bit lines 10 can be physically exposed at the bottom of each memory opening 49. The sidewalls of the memory openings 49 may be vertical, substantially vertical (i.e., with a taper angle less than 2 degrees), or tapered (i.e., with a taper angle of at least 2 degrees).

The pattern of the memory openings 49 replicates the pattern of the openings in the photoresist layer. In one embodiment, the memory openings 49 can be arranged as rows of openings that extend along the first horizontal direction hd1 such that the rows are repeated along the second horizontal direction hd2 (e.g., the memory openings 49 can optionally form columns that extend in direction hd2). The nearest neighbor spacing for the memory openings 49 along the first horizontal direction hd1 can be less than the nearest neighbor spacing along the second horizontal direction hd2. If the memory openings 49 are arranged in rows and columns, then the column spacing (i.e., pitch) is smaller than the row spacing (i.e., pitch). For example, the nearest neighbor spacing for the memory openings 49 along the first horizontal direction hd1 can be in a range from 5 nm to 50 nm (such as from 10 nm to 30 nm), and the nearest neighbor spacing along the second horizontal direction hd2 can be in a range from 30 nm to 300 nm (such as from 50 nm to 150 nm). In one embodiment, each memory opening 49 can have a circular or elliptical horizontal cross-sectional shape. The photoresist layer can be subsequently removed, for example, by ashing.

Referring to FIGS. 4A-4E, a sacrificial fill material can be deposited in the memory openings 49. The sacrificial fill material includes a material that can be subsequently removed selective to the materials of the alternating stack (32, 42) and selective to the material of the global bit lines 10. For example, the sacrificial fill material can include amorphous silicon, amorphous carbon, diamond-like carbon, germanium, or a silicon-germanium alloy. Excess portions of the sacrificial fill material can be removed from above the top surface of the sacrificial matrix layer 72 by a planarization process, which can include chemical mechanical planarization and/or a recess etch. Each remaining portion of the sacrificial fill material constitutes a sacrificial pillar structure 39. The sacrificial pillar structures 39 can include the same material as the etch mask layer 71, or can include a material that is different from the material of the etch mask layer 71. In one embodiment, the sacrificial pillar structures 39 can comprise amorphous silicon and the etch mask layer 71 can comprise polysilicon.

The sacrificial pillar structures 39 are formed through the in-process alternating stack (32, 42), and the sacrificial pillar structures 39 can be arranged in rows that extend along the first horizontal direction hd1 and laterally spaced among one another along the second horizontal direction hd2. In one embodiment, the sacrificial pillar structures 39 can be arranged as a two-dimensional periodic array. In one embodiment, the first pitch of the sacrificial pillar structures 39 along the first horizontal direction hd1 can be in a range from 45 nm to 180 nm, although lesser or greater dimensions can also be employed for the first pitch. The second pitch of the sacrificial pillar structures 39 along the second horizontal direction hd2 can be in a range from 75 nm to 300 nm, although lesser and greater dimensions can also be employed for the second pitch. The ratio of the second pitch to the first pitch can be greater than 1, and may be in a range from 1.2 to 2.4. The nearest neighbor spacing between the sacrificial pillar structures 39 along the first horizontal direction hd1 can be in a range from 5 nm to 50 nm (such as from 10 nm to 30 nm), and the nearest neighbor spacing between the sacrificial pillar structures 39 along the second horizontal direction hd2 can be in a range from 30 nm to 300 nm (such as from 50 nm to 150 nm), although lesser or greater dimensions can also be employed.

In one embodiment, sacrificial pillar structures 39 within each row among the rows of the sacrificial pillar structures 39 are laterally spaced apart along the first horizontal direction hd1 with a center-to-center pitch as a one-dimensional array, and rows of the sacrificial pillar structures 39 are laterally spaced apart along the second horizontal direction hd2 with a row-to-row pitch that is greater than the center-to-center pitch.

Referring to FIGS. 5A-5E, the sacrificial matrix layer 72 can be removed selective to the material of the etch stop layer 71 and the sacrificial pillar structures 39. An isotropic etch or an anisotropic etch can be employed to remove the sacrificial matrix layer 72 selective to the etch stop layer 71 and the sacrificial pillar structures 39. For example, if each of the etch stop layer 71 and the sacrificial pillar structures 39 includes a semiconductor material (such as polysilicon and amorphous silicon) or a carbon-containing material (such as amorphous carbon or diamond-like carbon) and if the sacrificial matrix layer 72 includes a silicon oxide-based material such as undoped silicate glass or a doped silicate glass (such as borosilicate glass or borophosphosilicate glass), the sacrificial matrix layer 72 can be removed by a wet etch employing hydrofluoric acid. Upper portions of the sacrificial pillar structures 39 protrude above the top surface of the etch stop layer 71 with a smaller spacing between neighboring pairs of sacrificial pillar structures 39 spaced along the first horizontal direction hd1 and with a larger spacing between neighboring pairs of sacrificial pillar structures spaced along the second horizontal direction hd2. The height of the protrusion of the sacrificial pillar structures 39 can be the same as the thickness of the sacrificial matrix layer 72, which can be, for example, in a range from 50 nm to 500 nm, although lesser and greater heights can also be employed.

Referring to FIGS. 6A-6E, a conformal material layer 73L can be deposited on over the etch mask layer 71 and the array of protruding portions of the sacrificial pillar structures 39. The conformal material layer 73 includes a material that is different from the materials of the etch mask layer 71 and the sacrificial pillar structures 39. For example, if each of the etch stop layer 71 and the sacrificial pillar structures 39 includes a semiconductor material or a carbon-containing material, the conformal material layer 73L can include a dielectric material such as silicon oxide or silicon nitride. The thickness of the conformal material layer 73L can be greater than one half of the nearest neighbor spacing between the sacrificial pillar structures 39 along the first horizontal direction (e.g., row direction) hd1, and can be less than one half of the nearest neighbor spacing between the sacrificial pillar structures 39 along the second horizontal direction (e.g., column direction) hd2. The conformal material layer 73L can be deposited by a conformal deposition process such as low pressure chemical vapor deposition (LPCVD).

Each gap between neighboring pairs of sacrificial pillar structures 39 that are spaced along the first horizontal direction hd1 is completely filled with the conformal material layer 73L, while the gap between neighboring rows of sacrificial pillar structures 39 that are spaced along the second horizontal direction hd2 is not completely filled with the conformal material layer 73L. Thus, a continuous trench laterally extends along the first horizontal direction hd1 between each neighboring rows of protruding portions of the sacrificial pillar structures 39.

Referring to FIGS. 7A-7E, the conformal material layer 73L is isotropically etched to remove portions of the sacrificial matrix layer 73L outside regions between neighboring pairs of sacrificial pillar structures 39 that are spaced apart along the first horizontal direction hd1. In other words, the conformal material layer 73L is removed between adjacent rows which extend in direction hd1, but portions of the conformal material layer 73L remain inside each row between the sacrificial pillar structures 39. The duration of the isotropic etch process can be selected such that the conformal material layer 73L is removed from all regions except for the gaps between neighboring pairs of sacrificial pillar structures 39 that are spaced apart along the first horizontal direction hd1. In one embodiment, if the conformal material layer 73L includes silicon oxide, the isotropic etch process can be a wet etch process employing hydrofluoric acid.

Remaining portions of the conformal material layer 73L constitute sacrificial bridge structures 73. The sacrificial bridge structures 73 can be formed between upper portions of each neighboring pair of sacrificial pillar structures 39 that are spaced along the first horizontal direction hd1. In other words, the sacrificial pillar structures 39 are connected to adjacent sacrificial pillar structures 39 by the sacrificial bridge structures 73 in each row but not in each column. Because of the isotropic nature of the etch process employed to remove the material of the conformal material layer 73L, each of the sacrificial bridge structures 73 can be formed with a pair of concave sidewalls 731 (first sidewalls) that contact a respective pair of sacrificial pillar structures 39, and with another pair of concave sidewalls 732 (second sidewalls) that are physically exposed upon formation.

Referring to FIGS. 8A-8E, an etch mask material is deposited over the sacrificial bridge structures 73 and the sacrificial pillar structures 39. The etch mask material is a material that can be employed as an etch mask during subsequent etching of the sacrificial bridge structures 73. The etch mask material may be the same as, or may be different from, the material of the etch mask layer 71. If the sacrificial bridge structures 73 include silicon oxide or silicon nitride, the etch mask material can include a semiconductor material (such as amorphous silicon or polysilicon) or a carbon material (such as amorphous carbon or diamond-like carbon). Excess portions of the etch mask material can be removed from above a horizontal plane including the top surfaces of the sacrificial pillar structures 39 by a planarization process such as chemical mechanical planarization. Remaining portions of the etch mask material after the planarization process constitute a patterned mask layer 74. The patterned mask layer 74 covers areas that are not occupied by the sacrificial pillar structures 39 and the sacrificial bridge structures 73. Thus, the patterned mask layer 74 includes openings between rows of the sacrificial pillar structures 39 that are arranged along the first horizontal direction hd1. In one embodiment, the patterned mask layer 74 can be formed as multiple discrete strips that are laterally spaced among one another by combinations of sacrificial pillar structures 39 and sacrificial bridge structures 73 located within a same row that extend along the first horizontal direction hd1.

Referring to FIGS. 9A-9E, the sacrificial bridge structures 73 can be removed selective to the materials of the etch mask layer 71 and the patterned mask layer 74. For example, if the sacrificial bridge structures 73 include silicon oxide or silicon nitride, a wet etch process employing hydrofluoric acid or hot phosphoric acid can be employed to remove the sacrificial bridge structures 73 selective to the etch mask layer 71 and the patterned mask layer 74. Cavities 29A are formed between each neighboring upper portions of the sacrificial pillar structures 39 that are spaced along the first horizontal direction hd1. Each cavity 29A can have two pairs of concave sidewalls.

Referring to FIGS. 10A-10E, an anisotropic etch process can be employed to transfer the pattern of the cavities 29A within the patterned mask layer 74 and the sacrificial pillar structures 39 into the etch mask layer 71 to form cavities 29B between the sacrificial pillar structures 39 and in the etch mask layer 71. Thus, the combination of the patterned mask layer 74 and the sacrificial pillar structures 39 can be employed as an etch mask for the anisotropic etch process, which can be a reactive ion etch process. As discussed above, the material of the etch mask layer 71 may be the same as, or may be different from, the materials of the patterned mask layer 74 and the sacrificial pillar structures 39. If the material of the etch mask layer 71 is the same as at least one of the materials of the patterned mask layer 74 and the sacrificial pillar structures 39, the patterned mask layer 74 and/or upper portions of the sacrificial pillar structures 39 can be at least partly consumed during the anisotropic etch process. If the material of the etch mask layer 71 is different from the materials of the patterned mask layer 74 and the sacrificial pillar structures 39, the patterned mask layer 74 and/or upper portions of the sacrificial pillar structures 39 may, or may not, be significantly consumed during the anisotropic etch process. The pattern of cavities 29B in the etch mask layer 71 replicates the pattern of the cavities 29A in the combination of the patterned mask layer 74 and the sacrificial pillar structures 39. Portions of the top surface of the topmost insulating layer 32 can be physically exposed in the cavities 29B upon transfer of the pattern of the combination of the patterned mask layer 74 and the sacrificial pillar structures 39 through the etch mask layer 71. Optionally, the patterned mask layer 74 can be removed after this step by selective etching.

Referring to FIGS. 11A-11E, an anisotropic etch process is performed to etch portions of the in-process alternating stack (32, 42) from areas that are not covered by the etch mask layer 71, which are the same as the areas that are not covered by a combination of the patterned mask layer 74 and the sacrificial pillar structures 39. The transfer of the pattern in the etch mask layer 71 through the in-process alternating stack (32, 42) forms inter-pillar cavities 29, which are cavities formed in the areas that are not covered by the etch mask layer 71 below the cavities 29B in the etch mask layer 71. Each inter-pillar cavity 29 can vertically extend through the entirety of the in-process alternating stack (32, 42). Thus, a top surface of a respective one of the global bit lines 10 may be physically exposed underneath each inter-pillar cavity 29. An etch chemistry that etches the materials of the insulating layers 32 and the sacrificial material layers 42 selective to the material of the etch mask layer 71 can be employed for the anisotropic etch.

The inter-pillar cavities 29 are formed between each neighboring pair of sacrificial pillar structures 39 that are spaced apart along the first horizontal direction hd1. The in-process alternating stack (32, 42) is divided into multiple discrete alternating stacks (32, 42) that are laterally spaced among one another by the sacrificial pillar structures 39 and the inter-pillar cavities 29. Each of the multiple discrete alternating stacks (32, 42) can have a strip shape that extends along the first horizontal direction hd1, and can be laterally spaced apart along the second horizontal direction hd2. Each sidewall of the multiple discrete alternating stacks (32, 42) can have concave portions that contact a subset of the sacrificial pillar structures 39 and convex portions that are physically exposed to a subset of the inter-pillar cavities 29. Horizontal cross-sectional shapes of the inter-pillar cavities 29 can be the same as, or similar to, the horizontal cross-sectional shapes of the sacrificial bridge structures 73. The difference in the shapes, if any, may be due to the taper angle of the sidewalls of the sacrificial pillar structures 39 and/or an undercut during formation of the inter-pillar cavities 29.

Referring to FIGS. 12A-12E, a dielectric fill material is deposited into the inter-pillar cavities 29 to fill at least a predominant portion of the inter-pillar cavities 29. The dielectric fill material can include a silicon oxide-based material such as undoped silicate glass, doped silicate glass, organosilicate glass, or a spin-on-glass. The dielectric fill material can be deposited by a conformal deposition process such as low pressure chemical vapor deposition and/or by a self-planarizing deposition process such as spin coating. Excess portions of the deposited dielectric fill material can be removed from above the top surface of the topmost insulating layer 32 by a planarization process, which can include a recess etch and/or chemical mechanical planarization. In one embodiment, the etch mask layer 71 and tops of the sacrificial pillar structures 39 above the topmost insulating layer 32 can be removed during the planarization process.

Each remaining portion of the deposited dielectric fill material in the inter-pillar cavities constitutes a dielectric bridge structure 36, which bridges a neighboring pair of sacrificial pillar structures 39 that are laterally spaced apart along the first horizontal direction hd1. A reflow of the dielectric fill material may be optionally employed before, or after, the planarization process to reduce seams or cavities 369 that can be formed at the center of each dielectric bridge structure 36. If a reflow process is not employed, the dielectric bridge structures 36 may include a seam or a cavity 369 that extends vertically along multiple levels of layers within the alternating stacks (32, 42).

Each dielectric bridge structure 36 includes a remaining portion of the deposited dielectric fill material and is located within a respective inter-pillar cavity 29. In one embodiment, each of the dielectric bridge structures 36 can be formed with a first pair of concave sidewalls 361 that contact a respective pair of sacrificial pillar structures 39 and a second pair of concave sidewalls 362 that contact remaining portions of the in-process alternating stack (32, 42) at the processing steps of FIGS. 10A-10E, which are multiple alternating stacks (32, 42) at the processing steps of FIGS. 12A-12E.

In one embodiment, each of the sacrificial material layers 42 within the vertically alternating stacks (32, 42) can have a laterally undulating sidewall that includes concave sidewall sections that contact sidewalls of a subset of the sacrificial pillar structures 39 arranged along a row extending along the first horizontal direction hd1 and convex sidewall sections that contact sidewalls of a subset of the dielectric bridge structures 36 that is arranged in a row extending along the first horizontal direction 36.

Referring to FIGS. 13A-13E, the sacrificial pillar structures 39 are removed selective to the materials of the alternating stacks (32, 42) (which are the same as the materials of the in-process alternating stack (32, 42) at the processing steps of FIGS. 10A-10E), the dielectric bridge structures 36, and the global bit lines 10. For example, if the sacrificial pillar structures 39 include amorphous silicon or polysilicon, a wet etch employing a KOH solution can be employed to remove the sacrificial pillar structures 39 selective to the alternating stacks (32, 42), the dielectric bridge structures 36, and the global bit lines 10. Pillar cavities 19 are formed in volumes from which the sacrificial pillar structures 39 are removed. The pillar cavities 19 can include a subset of the volumes of the memory openings 49 as provided at the processing steps of FIGS. 3A-3E, and specifically, the subset of the volumes of the memory openings at the levels of the alternating stacks (32, 42) because the etch mask layer 71 and the sacrificial matrix layer 72 are not present at this processing step.

Referring to FIGS. 14A-14E, an etchant that selectively etches the material of the sacrificial material layers 42 with respect to the material of the insulating layers 32 can be introduced into the pillar cavities 19, for example, employing an isotropic etch process. Lateral recesses 43 are formed in volumes from which the sacrificial material layers 42 are removed. The removal of the sacrificial material layers 42 can be selective to the materials of the insulating layers 32 and the global bit lines 10. In one embodiment, the sacrificial material layers 42 can include silicon nitride, and the material of the insulating layers 32 can be silicon oxide.

The etch process that removes the sacrificial material layers 42 selective to the insulating layers 32 can be a wet etch process employing a wet etch solution, or can be a gas phase (dry) etch process in which the etchant is introduced in a vapor phase into the pillar cavities 19. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The dielectric bridge structures 36 provide structural support during formation of the lateral recesses 43, and while the lateral recesses 43 are present within volumes previously occupied by the sacrificial material layers 42.

Each lateral recess 43 can be a laterally extending cavity having a lateral dimension that is greater than the vertical extent of the cavity. In other words, the lateral dimension of each lateral recess 43 can be greater than the height of the lateral recess 43. A plurality of lateral recesses 43 can be formed in the volumes from which the sacrificial material layers 42 are removed. Each of the plurality of lateral recesses 43 can extend substantially parallel to the top surface of the substrate 6. A lateral recess 43 can be vertically bounded by a top surface of an underlying insulating layer 32 and a bottom surface of an overlying insulating layer 32. In one embodiment, each lateral recess 43 can have a uniform height throughout.

Referring to FIGS. 15A-15E, at least one conductive material can be deposited in the lateral recesses 43 and at the periphery of each pillar cavity 19 by a respective conformal deposition process. For example, a combination of a metallic barrier layer and a metal fill material can be sequentially deposited. In this case, the metallic barrier layer includes an electrically conductive metallic material that can function as a diffusion barrier layer and/or adhesion promotion layer for a metallic fill material to be subsequently deposited. The metallic barrier layer can include a conductive metallic nitride material such as TiN, TaN, WN, or a stack thereof, or can include a conductive metallic carbide material such as TiC, TaC, WC, or a stack thereof. In one embodiment, the metallic barrier layer can be deposited by a conformal deposition process such as chemical vapor deposition (CVD) or atomic layer deposition (ALD). The thickness of the metallic barrier layer can be in a range from 2 nm to 8 nm, such as from 3 nm to 6 nm, although lesser and greater thicknesses can also be employed. In one embodiment, the metallic barrier layer can consist essentially of a conductive metal nitride such as TiN. Subsequently, the metal fill material is deposited on the metallic barrier layer to form a metallic fill material layer. The metallic fill material can be deposited by a conformal deposition method, which can be, for example, chemical vapor deposition (CVD), atomic layer deposition (ALD), electroless plating, electroplating, or a combination thereof. In one embodiment, the metallic fill material layer can consist essentially of at least one elemental metal. The at least one elemental metal of the metallic fill material layer can be selected, for example, from tungsten, cobalt, ruthenium, titanium, and tantalum. In one embodiment, the metallic fill material layer can consist essentially of a single elemental metal. In one embodiment, the metallic fill material layer can be deposited employing a fluorine-containing precursor gas such as $WF_6$. In one embodiment, the metallic fill material layer can be a tungsten layer including a residual level of fluorine atoms as impurities.

The portions of the at least one conductive material that are deposited in the pillar cavities 19 and over the topmost insulating layer 32 can be removed by an etch back process, which may include an isotropic etch process and/or an anisotropic etch process. Each remaining continuous portion of the deposited conductive material(s) in the lateral recesses 43 constitutes an electrically conductive layer 46. A plurality of electrically conductive layers 46 can be formed in the plurality of lateral recesses 43. The sacrificial material layers 42 are replaced with material portions that include the electrically conductive layer 46. In this case, each sacrificial material layer 42 can be replaced with an electrically conductive layer 46. Alternatively, the electrically conductive layer 46 comprises a single material, such as TiN or tungsten.

Each electrically conductive layer 46 can function as a word line of a vertical (i.e., three dimensional) memory device, such as a ReRAM device. In other words, each electrically conductive layer 46 can be a common control gate electrode for the plurality of memory cells in one level of a vertical memory device, such as a ReRAM device.

Referring to FIGS. 16A-16E, memory material portions can be formed at a periphery of each of the pillar cavities 19. In an illustrative example, a memory-material-containing layer stack 180 can be formed on the sidewalls of the pillar cavities 19 by conformal deposition of material layers followed by an anisotropic etch that removes horizontal portions of the material layers from above the topmost insulating layer 32 and from the bottom surfaces of the pillar cavities 19.

In one embodiment, the memory-material-containing layer stack 180 can include a selector element (84, 86) and a resistive memory material layer 82. The selector element (84, 86) and the resistive memory material layer 82 can be formed in either order as part of the stack 180. The resistive memory material layer 82 can be deposited on the selector element (84, 86) or the selector element (84, 86) can be deposited on the resistive memory material layer 82.

Each portion of the resistive memory material layer 82 at a level of word line 46 constitutes a resistive memory element. In other words, the resistive memory elements are embodied as portions of the resistive memory material layer 82 at the levels of the word lines 46. In one embodiment, the resistive memory material layer 82 can include a filament-forming dielectric material providing a reduced resistivity upon formation of conductive filaments therein (such as a hafnium oxide layer), or a phase change material, such as a chalcogenide material (e.g., Ge—Sb—Te (GST) type material), which changes its phase (e.g., amorphous to crystalline and vice-versa) upon application of a current or voltage thereto.

In another embodiment, the resistive memory material layer 82 can be a barrier modulated cell (BMC) material such as a sub-stoichiometric titanium oxide layer, whose resistivity varies based on oxygen interstitial and/or vacancy diffusion under an applied current or voltage. For example, in one type of BMC cell, oxygen interstitial (Oi) generation can occur in the barrier oxide ($SiO_2$) at the amorphous silicon (a-Si) barrier—$TiO_x$ interface during a RESET operation (i.e., resetting the stack into the high resistivity state, HRS), and the oxygen interstitials can drift into defect rich $TiO_x$ where the oxygen interstitials cause a re-oxidation of the $TiO_x$ near the interface. This re-oxidation decreases the conductivity of the $TiO_x$ layer and hence increases the resistance of the BMC stack and the cell is switched into the HRS state. During the SET operation, opposite voltage is applied across the stack, and Ti—O bonds are supposed to be broken down to generate Oi and oxygen vacancy (Vo) pair. Oi will drift back to the a-Si/$TiO_x$ interface along the electric field to set the stack into the low resistivity state (LRS).

The resistive memory material layer 82 can be formed by a conformal deposition process such as atomic layer deposition or chemical vapor deposition. The resistive memory material layer 82 can have a thickness in a range from 3 nm to 15 nm, although lesser and greater thicknesses can also be employed. While an exemplary resistive memory material is described herein, it is understood that any other resistive memory material may be employed in the configuration of the present disclosure provided that memory-material-containing layer stacks 180 can be formed as cylindrical structures at peripheries of the pillar cavities 19.

In one embodiment, a "selector element" (84, 86) can be a non-linear device that turns on under a first set of electrical bias conditions and turns off under a second set of electrical bias conditions. For example, a selector element may turn on under conditions in which the electrical field strength exceeds a critical value. A selector element may be unidirectional or bidirectional. A diode is an exemplary selector element. However, selector elements displaying non-diodic electrical characteristics can also be employed. The memory-material-containing layer stack 180 is a memory-material-containing structure in which selector elements are embodied as portions of a selector element (84, 86), and resistive memory elements are embodied as portions of a resistive memory material layer 82.

In another embodiment, the selector element (84, 86) can include a barrier material layer 84 and an optional conductive material layer 86 of a BMC cell. The barrier material layer 84 includes a barrier material that has a suitable combination of a band gap and thickness in order to limit electrical current therethrough at low electrical fields, while allowing a significant amount of electrical current to pass through at high electrical fields. For example, the barrier material layer 84 can include amorphous silicon, amorphous germanium, an amorphous silicon germanium alloy, or aluminum oxide. The barrier material layer 84 can have a lateral thickness in a range from 3 nm to 15 nm, although lesser and greater thicknesses can also be employed. The conductive material layer 86 includes a conductive material such as a metallic nitride (e.g., TiN, TaN, or WN). The layer stack of a conductive material layer 86 and the barrier material layer 84 constitutes the selector element (84, 86).

Referring to FIGS. 17A-17E, at least one conducive material can be deposited in remaining volumes of the pillar cavities 19. The at least one conductive material can be deposited by a conformal deposition process to form an electrode layer 60L, which can fill the entire volume of the remaining portions of the pillar cavities 19. The electrode layer 60L can include at least one doped semiconductor material and/or at least one metallic material. For example, the electrode layer 60L can include heavily doped polysilicon, a conductive metallic nitride (such as TiN, TaN, or WN), an elemental metal portion (such as W, Cu, or Al), or an intermetallic alloy.

Referring to FIGS. 18A-18E, portions of the electrode layer 60L overlying the topmost insulating layer 32 can be removed by a planarization process, which can employ chemical mechanical planarization and/or a recess etch. Each remaining portion of the electrode layer 60L located within a respective pillar cavity 19 constitutes a vertical electrode (e.g., local bit line) 60, which can be a vertical bit line connected to a respective one of the global bit lines 10. Each sacrificial pillar structure 39 is thus replaced with a pillar structure (180, 60), which includes a respective vertical electrode 60 therein. In this case, each pillar structure (180, 60) can further include a memory-material-containing layer stack 180 having a cylindrical configuration.

Figure 19C:
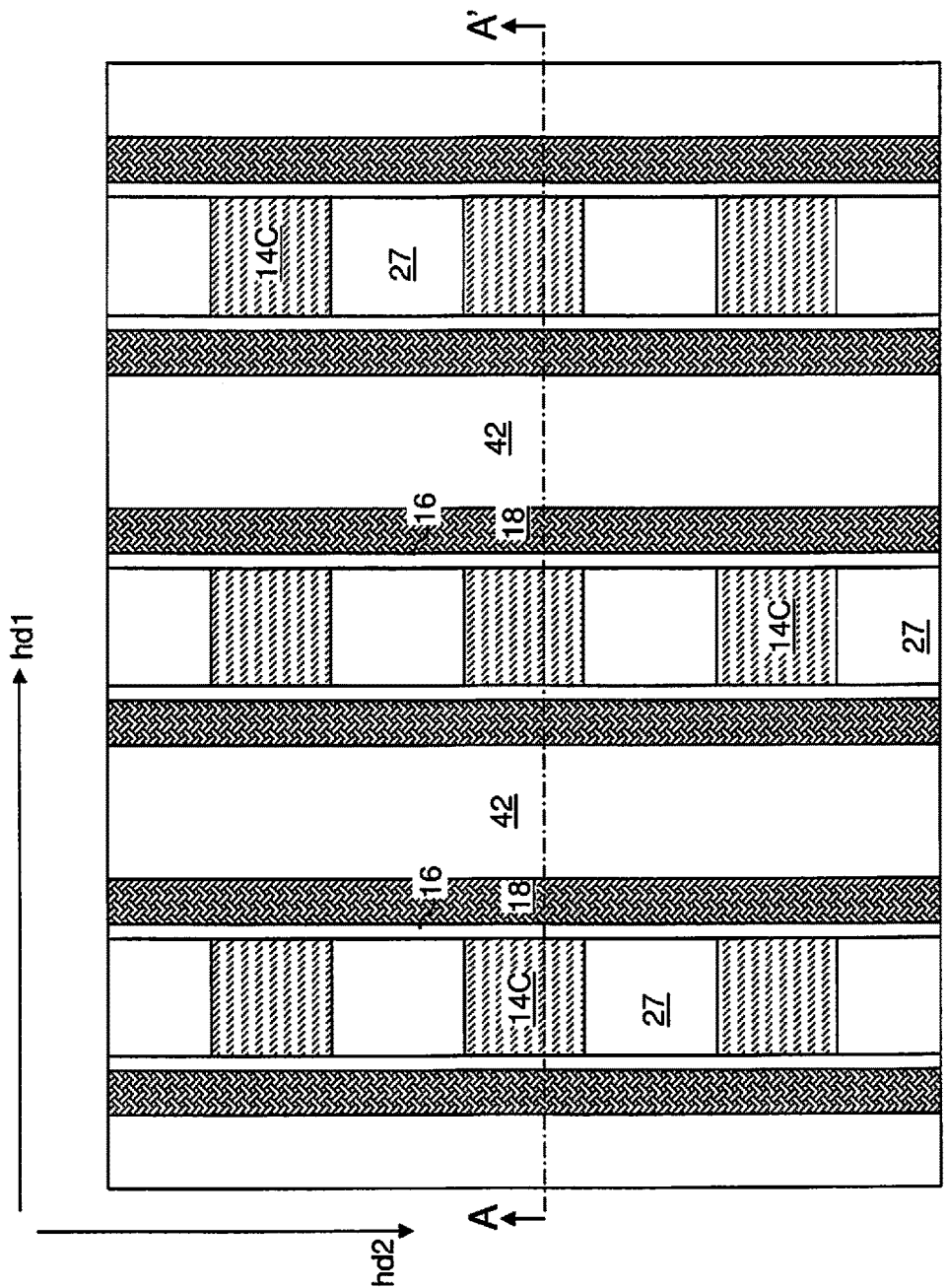

Referring to FIGS. 19A-19C, a second exemplary structure according to a second embodiment of the present disclosure is illustrated. The second exemplary structure can be derived from the first exemplary structure by forming vertical field effect transistors as bit line access transistor for the vertical bit lines, which are embodied as the vertical electrodes 60.

Each bit line access transistor can be a vertical field effect transistor, and can include a bottom active region 14B (which can be a source region or a drain region), a semiconductor channel 14C, and a top active region 14T (which can be a drain region if the underlying bottom active region 14B is a source region, and a source region if the underlying bottom active region 14C is a drain region). As used herein, an "active region" refers to a source region or a drain region. The bit line access transistors include gate dielectrics 16 that are formed on sidewalls of each semiconductor material stack (14B, 14C, 14T), and gate electrodes 18 that extend along a horizontal direction (such as the second horizontal direction hd2). Dielectric material portions (40, 42, 27) provide lateral electrical isolation among the bit line access transistors. The dielectric material portions (40, 42, 27) can include, for example, a spacer dielectric layer 40, dielectric rail structures 42, and dielectric pillar structures 27. The bit line access transistors can have the same periodicity as the array of memory openings 49, and as the array of vertical electrodes 60. Upon formation of the bit line access transistors, the processing steps of FIGS. 2A-2E can be performed, followed by additional processing steps of the first embodiment to provide the second exemplary structure.

Figure 20:
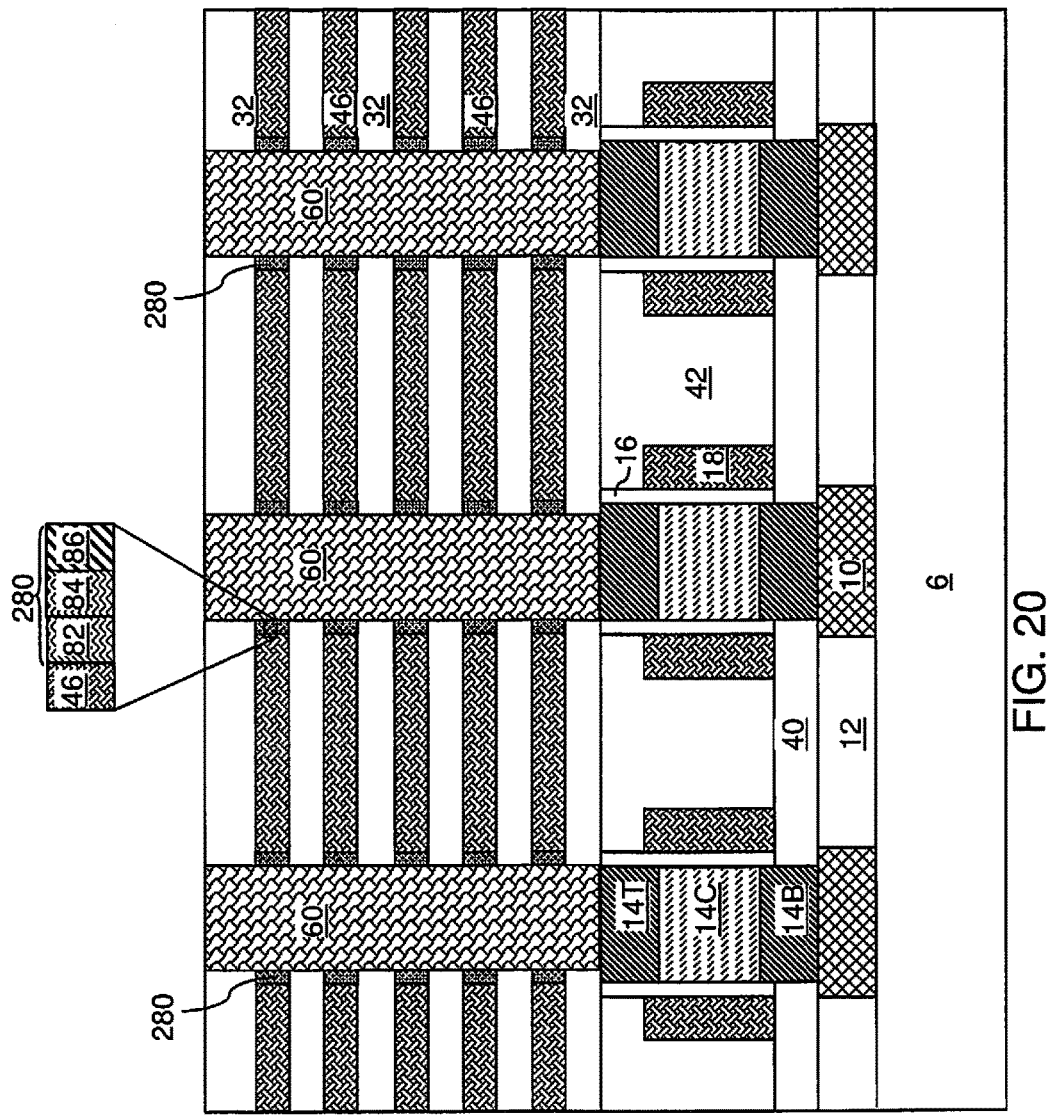
FIG. 20 is a vertical cross-sectional view of a third exemplary structure according to a third embodiment of the present disclosure.

Referring to FIG. 20, a third exemplary structure according to a third embodiment of the present disclosure is illustrated. The third exemplary structure can be derived from the second exemplary structure by laterally recessing the electrically conductive layers 46 after the processing steps of FIGS. 15A-15E. A memory-material-containing layer stack 280 can be formed within each recessed region around the pillar cavity 19 by conformal deposition of material layers followed by an anisotropic etch that removes horizontal portions of the material layers from above the topmost insulating layer 32 and from the bottom surfaces of the pillar cavities 19. In one embodiment, each memory-material-containing layer stack 280 can include a selector element (84, 86) and a resistive memory material layer 82.

The discrete memory-material-containing layer stacks 280 can be formed at each level of the electrically conductive layer 46. Subsequently, the processing steps of FIGS. 17A-17E and 18A-18E can be performed to provide the third exemplary structure.

Referring to FIGS. 21A-21E, an alternate configuration of the first exemplary structure is shown, which is derived from the first exemplary structure of FIGS. 5A-5E by anisotropically etching the etch mask layer 71 under processing conditions that induce a microloading effect. The micro loading is an effect that is inherent in many anisotropic reactive ion etch process in which narrow regions between adjacent masking structures are etched at a higher etch rate than regions that are spaced from the masking structures. In this case, the narrow regions are regions of the etch mask layer 71 located between neighboring pairs of sacrificial pillar structures 39 that are spaced apart along the first horizontal direction hd1. The masking structures are the protruding portions of the sacrificial pillar structures 39. The parameters of the anisotropic reactive ion etch process employed to etch the narrow regions of the etch mask layer 71 can be selected to maximize the microloading effect, for example, by selecting process pressure, etch bias, and the gas species. The etch mask layer 71 can form openings 29C only between each neighboring pair of sacrificial pillar structures 39 that are spaced along the first horizontal direction, while being thinned in regions that are spaced in other regions without forming openings in the other regions.

Referring to FIGS. 22A-22E, the processing steps of FIGS. 11A-11E can be performed to etch portions of the alternating stack (32, 42) that underlie the openings in the etch mask layer 71. Inter-pillar cavities 29 are formed between each neighboring pair of sacrificial pillar structures 39 that are spaced apart along the first horizontal direction hd1. The in-process alternating stack (32, 42) is divided into multiple discrete alternating stacks (32, 42) that are laterally spaced among one another by the sacrificial pillar structures 39 and the inter-pillar cavities 29. Each of the multiple discrete alternating stacks (32, 42) can have a strip shape that extends along the first horizontal direction hd1, and can be laterally spaced apart along the second horizontal direction hd2. Each sidewall of the multiple discrete alternating stacks (32, 42) can have concave portions that contact a subset of the sacrificial pillar structures 39 and convex portions that are physically exposed to a subset of the inter-pillar cavities 29.

The processing steps of FIGS. 12A-12E and the subsequent processing steps can be performed to provide the structure illustrated in FIGS. 18A-18E.

Thus, in some embodiments, sacrificial pillar structures are formed through an alternating stack of insulating layers and sacrificial material layers as a two-dimensional array structure including multiple rows of sacrificial pillar structures. The in-row pitch of the sacrificial pillar structures can be less than inter-row pitch to enable formation of sacrificial bridge structures at gaps between neighboring sacrificial pillar structures within each row. A patterned mask layer is formed to mask areas between the sacrificial pillar structures and the sacrificial bridge structures. Portions of the alternating stack that are not covered by the sacrificial pillar structures and the patterned mask layer are anisotropically etched to form inter-pillar cavities, which are filled with a dielectric material to form dielectric bridge structures. The sacrificial pillar structures are replaced with pillar structures that include vertical electrodes. The dielectric bridge structures provide additional structural support during replacement of the sacrificial material layers with electrically conductive layers.

Each of the exemplary structures can include a three-dimensional memory device. The three-dimensional memory device can include vertically alternating stacks (32, 46) located over a substrate 6, wherein each of the vertically alternating stacks (32, 46) comprises insulating layers 32 and electrically conductive layers 46 that alternate along a vertical direction, and each of the vertically alternating stacks (32, 46) laterally extends along a first horizontal direction hd1; rows of pillar structures {60 or (180, 60)} vertically extending from topmost layers of the vertically alternating stacks (32, 46) to bottommost layers of the alternating stacks (32, 46), wherein each of the pillar structures {60 or (180, 60)} comprises a respective vertical electrode 60 therein, and each row of pillar structures {60 or (180, 60)} is located between a respective neighboring pair of vertical alternating stacks (32, 46) that are spaced along a second horizontal direction hd2; memory material portions (which are portions of the resistive memory material layer 82 that are adjacent to the electrically conductive layers 46) located within, or on, a respective one of the pillar structures {60 or (180, 60)}; and dielectric bridge structures 36 located between each neighboring pair of pillar structures {60 or (180, 60)}.

In one embodiment, each of the dielectric bridge structures 36 comprises a first pair of concave sidewalls 361 that contact convex sidewalls of a respective neighboring pair of pillar structures {60 or (180, 60)}. Each of the dielectric bridge structures 36 can comprise a second pair of concave sidewalls 362 that contact convex sidewalls of a respective pair of vertically alternating stacks (32, 46).

In one embodiment, the dielectric bridge structures 36 can have a different composition than the insulating layers 32 within the vertically alternating stacks (32, 46). For example, the dielectric bridge structures 36 can include a doped silicate glass (such as borosilicate glass or phosphosilicate glass), and the insulating layers 32 can include an undoped silicate glass.

In one embodiment, the memory material portions comprise resistive memory material layers 82 contacting an inner sidewall of a respective one of the vertical electrodes 60 and continuously vertically extending from topmost layers of a pair of the vertically alternating stacks (32, 46) to bottommost layers of the pair of the vertically alternating stacks (32, 46) as in the case of the first and second exemplary structures.

In one embodiment, the memory material portions can be located at each level of the electrically conductive layers 46, laterally surround a respective one of the pillar structures 60, and be vertically spaced among one another by the insulating layers 32 as in the case of the third and fourth exemplary structures.

In one embodiment, pillar structures {60 or (180, 60)} within each row among the rows of the pillar structures {60 or (180, 60)} are laterally spaced apart along the first horizontal direction hd1 with a center-to-center pitch as a one-dimensional array, and rows of the pillar structures {60 or (180, 60)} are laterally spaced apart along the second horizontal direction hd2 with a row-to-row pitch that is greater than the center-to-center pitch. Global bit lines 10 can be provided, each of which laterally extends along the first horizontal direction hd1 or the second horizontal direction hd2 and is electrically connected to a respective subset of the vertical electrodes 60 directly or through a bit line access transistor.

In one embodiment, each of the electrically conductive layers 46 within the vertically alternating stacks (32, 46) can have a laterally undulating sidewall that includes concave sidewall sections that contact sidewalls of a subset of the pillar structures {60 or (180, 60)} arranged along a row extending along the first horizontal direction hd1 and convex sidewall sections that contact sidewalls of a subset of the dielectric bridge structures 36 that is arranged in a row extending along the first horizontal direction 36.

In one embodiment, the rows of pillar structures {60 or (180, 60)} are periodically spaced apart along the second horizontal direction hd2 such that the pillar structures {60 or (180, 60)} are arranged as a first two-dimensional periodic array in a plan view, and the dielectric bridge structures 36 are arranged as a second two-dimensional periodic array in the plan view, wherein the first and second two-dimensional periodic arrays have a same set of periodicities along the first horizontal direction hd1 and along the second horizontal direction hd2. In one embodiment, the electrically conductive layers 46 within the vertically alternating stacks (32, 46) can have an undulating width along the second horizontal direction hd2, wherein the undulating width modulates between a respective maximum and a respective minimum along the first horizontal direction hd1.

In one embodiment, each of the pillar structures {60 or (180, 60)} vertically extends from a level of topmost layers of the vertically alternating stacks (32, 46) to a level of bottommost layers of the vertically alternating stacks (32, 46), and each of the dielectric bridge structures 36 vertically extends from the level of the topmost layers of the vertically alternating stacks (32, 46) to the level of the bottommost layers of the vertically alternating stacks (32, 46).

The various embodiment structures of the present disclosure allow replacement of the sacrificial material layers 42 while the dielectric bridge structures 36 provide structural support while the lateral recesses 43 are present. Thus, collapse of the insulating layers 32 during replacement of the sacrificial material layers 42 with electrically conducive layers 46 can be avoided. The dielectric bridge structures 36 provide lateral electrical isolation between the vertical electrodes 60, which are vertical bit lines. Additional non-limiting advantages include a possibility to increase the number of word line stacks, reduce the device pitch due to the decreased risk of pattern collapse and omission of expensive and complex photolithography patterns used in prior art methods.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device comprising:
vertically alternating stacks located over a substrate, wherein each of the vertically alternating stacks comprises insulating layers and electrically conductive lay- ers that alternate along a vertical direction, and each of the vertically alternating stacks laterally extends along a first horizontal direction;

rows of pillar structures vertically extending from topmost layers of the vertically alternating stacks to bottommost layers of the alternating stacks, wherein:

each of the pillar structures comprises a respective vertical electrode, and each row of pillar structures is located between a respective neighboring pair of vertical alternating stacks that are spaced along a second horizontal direction;

the pillar structures within each row among the rows of the pillar structures are laterally spaced apart along the first horizontal direction with a center-to-center pitch as a one-dimensional array; and rows of the pillar structures are laterally spaced apart along the second horizontal direction with a row-to-row pitch that is greater than the center-to-center pitch;

memory material portions located within, or on, a respective one of the pillar structures; and dielectric bridge structures located between each neighboring pair of pillar structures, wherein each of the dielectric bridge structures comprises a first pair of concave sidewalls that contact convex sidewalls of a respective neighboring pair of pillar structures.

2. The three-dimensional memory device of claim 1, wherein each of the dielectric bridge structures comprises a second pair of concave sidewalls that contact convex sidewalls of a respective pair of vertically alternating stacks.

3. The three-dimensional memory device of claim 1, wherein the dielectric bridge structures have a different composition than the insulating layers within the vertically alternating stacks.

4. The three-dimensional memory device of claim 1, wherein the memory material portions comprise resistive memory material layers contacting an inner sidewall of a respective one of the vertical electrodes and continuously vertically extending from topmost layers of a pair of the vertically alternating stacks to bottommost layers of the pair of the vertically alternating stacks.

5. The three-dimensional memory device of claim 1, wherein the memory material portions are located at each level of the electrically conductive layers, laterally surround a respective one of the pillar structures, and are vertically spaced among one another by the insulating layers.

6. The three-dimensional memory device of claim 1, further comprising global bit lines laterally extending along the first horizontal direction or the second horizontal direction and electrically connected to a respective subset of the vertical electrodes.

7. The three-dimensional memory device of claim 1, wherein each of the electrically conductive layers within the vertically alternating stacks has a laterally undulating sidewall that includes concave sidewall sections that contact sidewalls of a subset of the pillar structures arranged along a row extending along the first horizontal direction and convex sidewall sections that contact sidewalls of a subset of the dielectric bridge structures that is arranged in a row extending along the first horizontal direction.

8. The three-dimensional memory device of claim 1, wherein the electrically conductive layers within the vertically alternating stacks have an undulating width along the second horizontal direction, wherein the undulating width modulates between a respective maximum and a respective minimum along the first horizontal direction.

9. The three-dimensional memory device of claim 1, wherein:

each of the pillar structures vertically extends from a level of topmost layers of the vertically alternating stacks to a level of bottommost layers of the vertically alternating stacks; and each of the dielectric bridge structures vertically extends from the level of the topmost layers of the vertically alternating stacks to the level of the bottommost layers of the vertically alternating stacks.

* * * * *